(12) United States Patent
Dorf et al.

(10) Patent No.: US 12,057,292 B2
(45) Date of Patent: *Aug. 6, 2024

(54) FEEDBACK LOOP FOR CONTROLLING A PULSED VOLTAGE WAVEFORM

(71) Applicant: Applied Materials, Inc., Santa Clara, CA (US)

(72) Inventors: Leonid Dorf, San Jose, CA (US); Evgeny Kamenetskiy, Santa Clara, CA (US); James Rogers, Los Gatos, CA (US); Olivier Luere, Sunnyvale, CA (US); Rajinder Dhindsa, Pleasanton, CA (US); Viacheslav Plotnikov, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/201,358

(22) Filed: May 24, 2023

(65) Prior Publication Data

US 2023/0326717 A1    Oct. 12, 2023

Related U.S. Application Data

(63) Continuation of application No. 16/748,847, filed on Jan. 22, 2020, now Pat. No. 11,699,572.

(Continued)

(51) Int. Cl.
*H01J 37/32* (2006.01)
*H01L 21/311* (2006.01)
*H01L 21/683* (2006.01)

(52) U.S. Cl.
CPC .. *H01J 37/32128* (2013.01); *H01J 37/32082* (2013.01); *H01J 37/32146* (2013.01); (Continued)

(58) Field of Classification Search
CPC ............ H01J 37/3299; H01J 37/32082; H01J 37/32128; H01J 37/32146; H01J 37/32165; H01J 37/32174
See application file for complete search history.

(56) References Cited

U.S. PATENT DOCUMENTS

| 4,070,589 A | 1/1978 | Martinkovic |
| 4,340,462 A | 7/1982 | Koch |

(Continued)

FOREIGN PATENT DOCUMENTS

| CN | 101990353 A | 3/2011 |
| CN | 102084024 A | 6/2011 |

(Continued)

OTHER PUBLICATIONS

Chinese Office Action for Chinese Patent Application No. 202080006279.8 dated Jul. 28, 2023.

(Continued)

*Primary Examiner* — Tung X Le
(74) *Attorney, Agent, or Firm* — Patterson + Sheridan, LLP

(57) ABSTRACT

Embodiments of this disclosure describe a feedback loop that can be used to maintain a nearly constant sheath voltage and thus creating a mono-energetic IEDF at the surface of the substrate. The system described herein consequently enables a precise control over the shape of IEDF and the profile of the features formed in the surface of the substrate.

20 Claims, 17 Drawing Sheets

Related U.S. Application Data

(60) Provisional application No. 62/795,545, filed on Jan. 22, 2019.

(52) U.S. Cl.
CPC .. *H01J 37/32165* (2013.01); *H01J 37/32174* (2013.01); *H01J 37/3299* (2013.01); *H01L 21/31116* (2013.01); *H01J 2237/3341* (2013.01); *H01L 21/6831* (2013.01)

(56) References Cited

U.S. PATENT DOCUMENTS

| | | |
|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,682,067 A | 10/1997 | Manley et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,815,388 A | 9/1998 | Manley et al. |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |

(56) References Cited

U.S. PATENT DOCUMENTS

| | | |
|---|---|---|
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |

(56) References Cited

U.S. PATENT DOCUMENTS

| | | | |
|---|---|---|---|
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |

(56) References Cited

U.S. PATENT DOCUMENTS

| | | |
|---|---|---|
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0077150 A1* | 3/2009 | Wendt ............... H01J 37/32009 156/345.28 |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0024521 A1* | 1/2015 | Fukuchi ............... H01L 22/12 156/345.24 |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0171772 A1 | 6/2015 | Tallam et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0319838 A1 | 11/2015 | Bhutta |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0084432 A1 | 3/2017 | Valcore, Jr. et al. |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |

(56) References Cited

U.S. PATENT DOCUMENTS

| | | |
|---|---|---|
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157040 A1* | 5/2019 | Fairbairn .......... H01J 37/32146 |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0335305 A1* | 10/2020 | Long ................. H01J 37/32174 |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |

(56) References Cited

FOREIGN PATENT DOCUMENTS

| | | |
|---|---|---|
| JP | 2002299322 A | 10/2002 |
| JP | 4418424 B2 | 2/2010 |
| JP | 2011035266 A | 2/2011 |
| JP | 5018244 B2 | 9/2012 |
| JP | 2014112644 A | 6/2014 |
| JP | 2016-225439 A | 12/2016 |
| JP | 6741461 B2 | 8/2020 |
| KR | 100757347 B1 | 9/2007 |
| KR | 10-2007-0098556 A | 10/2007 |
| KR | 20160042429 A | 4/2016 |
| KR | 20200036947 A | 4/2020 |
| TW | 498706 B | 8/2002 |
| TW | 200506388 A | 2/2005 |
| TW | 201415523 A | 4/2014 |
| TW | 201533797 A | 9/2015 |
| TW | 201717247 A | 5/2017 |
| TW | 201737300 A | 10/2017 |
| TW | 201801224 A | 1/2018 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—High Gain and Frequency Ultra-Stable Integrators for Long Pulse and/or High Current Applications, 2018, 1 page.

Eagle Harbor Technologies webpage—"In Situ Testing of EHT Integrators on a Tokamak," 2015, 1 page.

Eagle Harbor Technologies webpage—"Long-Pulse Integrator Testing with DIII-D Magnetic Diagnostics," 2016, 1 page.

Sunstone Circuits—"Eagle Harbor Tech Case Study," date unknown, 4 pages.

Wang, S.B., et al.—"Control of ion energy distribution at substrates during plasma processing," Journal of Applied Physics, vol. 88, No. 2, Jul. 15, 2000, pp. 643-646.

Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Semiconductor Components Industries, LLC (SCILLC)—"Switch-Mode Power Supply" Reference Manual, SMPSRM/D, Rev. 4, Apr. 2014, ON Semiconductor, 73 pages.

PCT International Search Report and Written Opinion dated Nov. 9, 2018, for International Application No. PCT/US2018/043032.

(56) References Cited

OTHER PUBLICATIONS

Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
Electrical 4 U webpage—"Clamping Circuit," Aug. 29, 2018, 9 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, etal., filed Dec. 16, 2016; 22 total pages.
U.S. Appl. No. 15/424,405; entitled System for Tunable Workpiece Biasing in a Plasma Reactor; by Travis Koh, et al., filed Feb. 3, 2017; 29 total pages.
U.S. Appl. No. 15/618,082; entitled Systems and Methods for Controlling a Voltage Waveform at a Substrate During Plasma Processing; by Leonid Dorf, et al., filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.
Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, " Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With A DC Bias" A Dissertation in Physics. Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.
Taiwan Office Action for Application No. 109102592 dated Aug. 7, 2023.

* cited by examiner

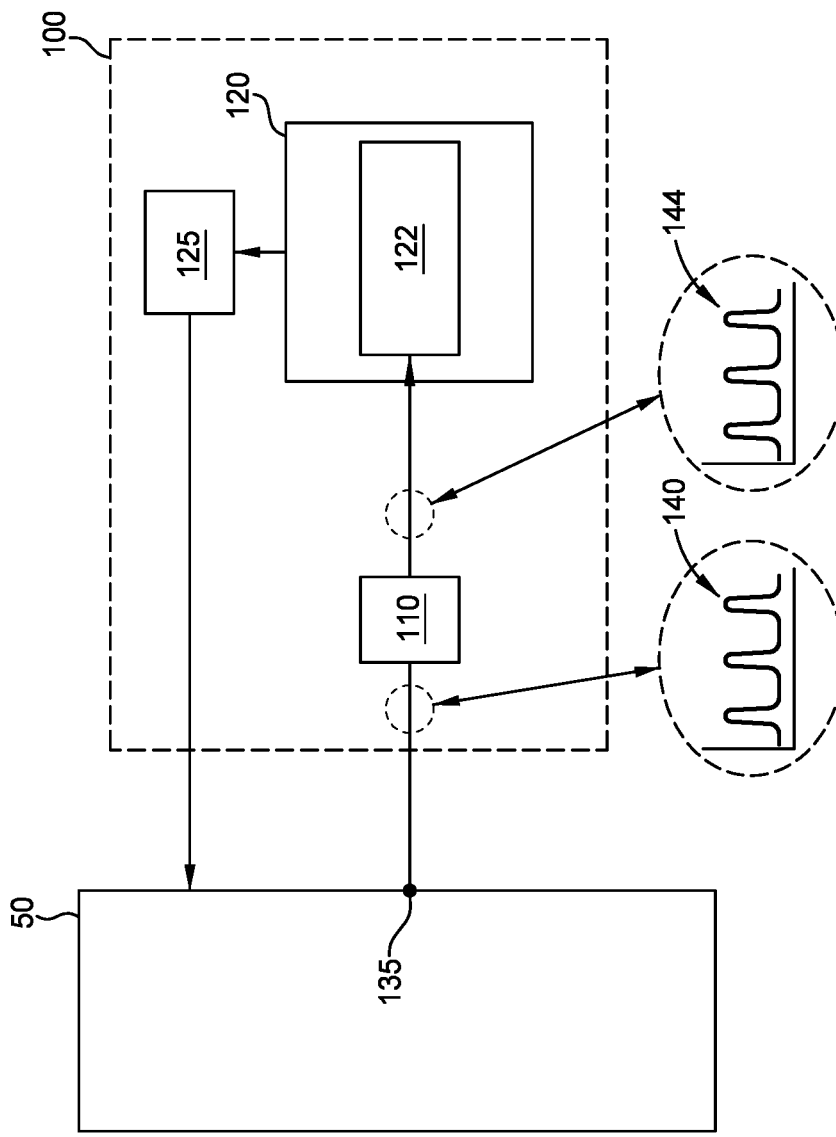

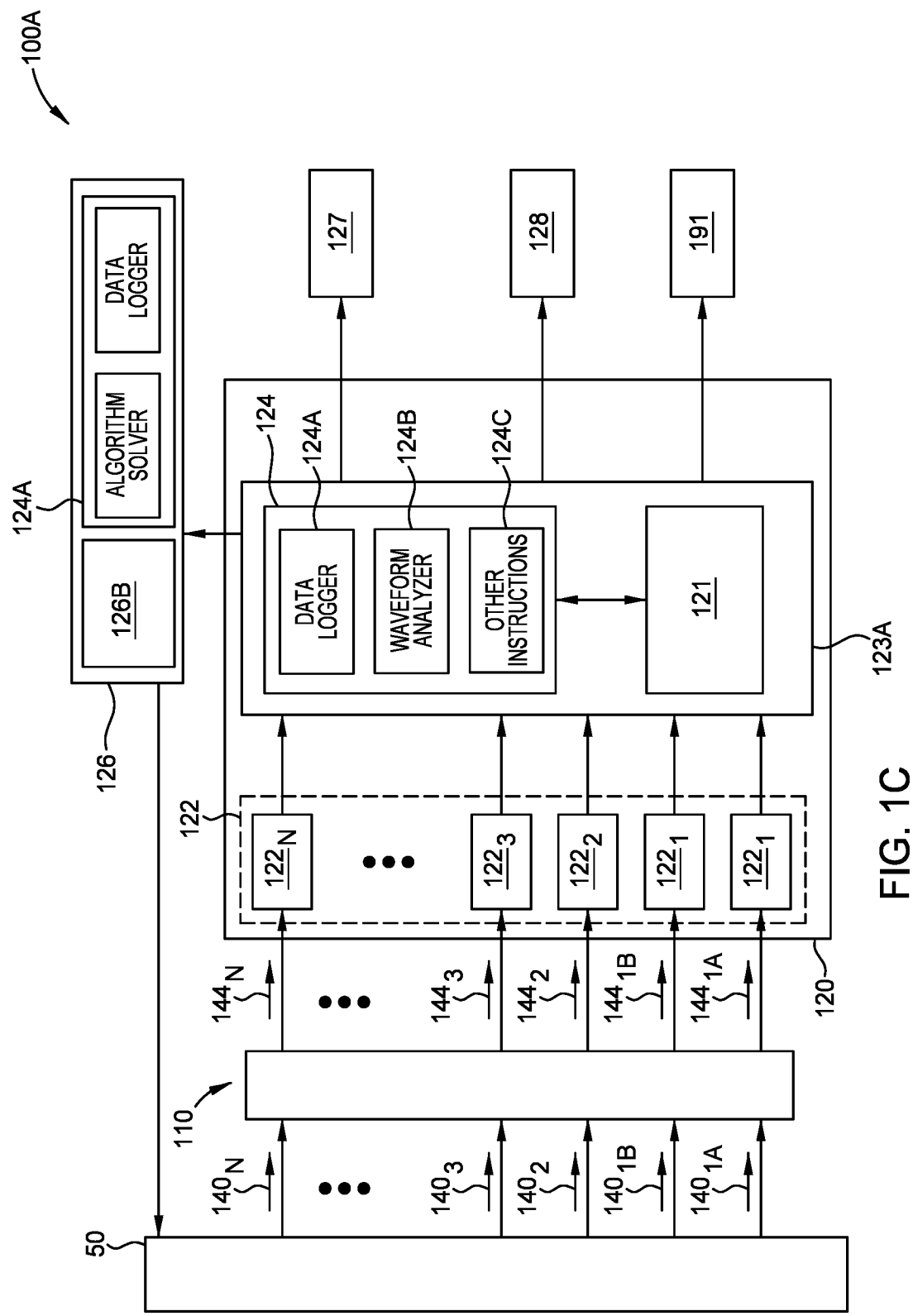

FEEDBACK LOOP FOR CONTROLLING A PULSED VOLTAGE WAVEFORM

CROSS REFERENCE TO RELATED APPLICATIONS

This application is a continuation of U.S. patent application Ser. No. 16/748,847, filed Jan. 22, 2020, which claims the benefit of U.S. provisional patent application Ser. No. 62/795,545, filed Jan. 22, 2019, which are both hereby incorporated herein by reference.

BACKGROUND

Field

Embodiments described herein generally relate to plasma processing chambers used in semiconductor manufacturing, and more specifically to an apparatus and methods of controlling the delivery of power to a plasma formed in a plasma processing chamber.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in an RIE processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a "power electrode" (e.g., a biasing electrode), such as a metal baseplate embedded into an "electrostatic chuck" (ESC) assembly, more commonly referred to as the "cathode". The power electrode is capacitively coupled to the plasma of a processing system through a thick layer of dielectric material (e.g., ceramic material), which is a part of the ESC assembly. The application of RF voltage to the power electrode causes an electron-repelling plasma sheath (also referred to as the "cathode sheath") to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropy. More specifically, ion directionality, the feature profile, and etch selectivity to the mask and the stop-layer are controlled by the Ion Energy Distribution Function (IEDF). In plasmas with RF bias, the IEDF typically has two peaks, one at a low energy and one at a high energy, and some ion population in between. The presence of the ion population in-between the two peaks of the IEDF is reflective of the fact that the voltage drop between the substrate and the plasma oscillates at the RF bias frequency. When a lower frequency, e.g., 2 MHz, RF bias generator is used to achieve higher self-bias voltages, the difference in energy between these two peaks can be significant; and because the etch profile due to the ions at low energy peak is more isotropic, this could potentially lead to bowing of the etched feature walls. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch. As feature sizes continue to diminish and the aspect ratio increases, while feature profile control requirements become more stringent, it becomes more desirable to have a well-controlled IEDF at the substrate surface during processing.

A pulsed voltage waveform generator (PVWG) may be used to create a pulsed voltage waveform at an electrode embedded in the electrostatic chuck (ESC) assembly in a semiconductor plasma chamber in order to maintain a particular substrate voltage waveform, and thus control the sheath voltage and the IEDF at the substrate during plasma processing. A difficulty in controlling the produced waveform may arise from real-time changes in the load, such as drifts in the plasma density, chamber walls conditions, substrate temperature, degree and state of chemical dissociation, in the case of a semiconductor plasma chamber used as a load. Therefore, a real-time information about the waveform can be very helpful in order to perform real-time adjustments to the PVWG control parameters (e.g., a charge voltage of DC power supplies or a pulse width controlled by the arbitrary waveform generator) and thus maintain a predetermined voltage waveform despite the changes in the load. Such real-time measurements and analysis performed together with real-time control is often referred to as "closed feedback loop operation". However, certain difficulties arise in measurements and analysis of a pulsed voltage waveform due to its very high amplitude (e.g. several to tens of kV, as is often the case in plasma processing), as well as due to the complex nature of a load, such as a semiconductor plasma chamber. When PVWG is connected to a complex load, which may include a series and/or parallel combination of discrete capacitive, inductive, resistive and nonlinear elements (e.g., plasma sheath at the substrate surface in a process chamber) as well as the distributed elements (e.g., a section of a transmission line), the produced waveform may have a much more complex structure than a theoretically predicted (expected) waveform and may include high frequency oscillations, which can affect the ability to repeatably control a plasma process.

Accordingly, there is a need in the art for novel biasing methods that enable maintaining a nearly constant sheath voltage, and thus create a desirable and repeatable monoenergetic IEDF at the surface of the substrate to enable a precise control over the shape of IEDF and the profile of the features formed in the surface of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1A is a schematic diagram of a feedback loop that is configured to be attached to a plasma processing chamber, according to one embodiment.

FIG. 1C is a schematic diagram illustrating an example of the feedback loop illustrated in FIG. 1A, according to one embodiment.

To facilitate understanding, identical reference numerals have been used, where possible, to designate identical elements that are common to the figures. It is contemplated that elements and features of one embodiment may be beneficially incorporated in other embodiments without further recitation.

SUMMARY

Figure 1B:
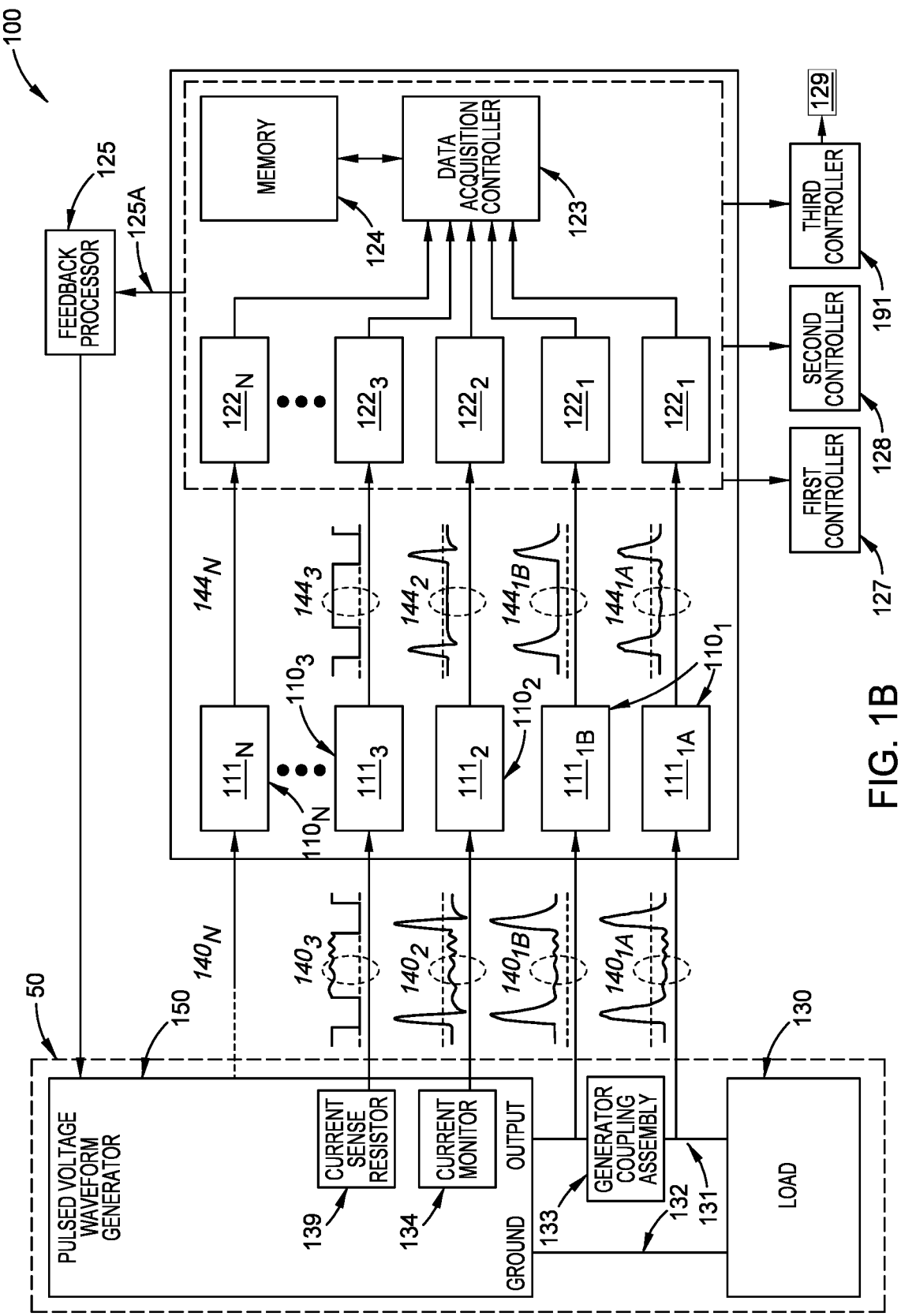
FIG. 1B is a schematic diagram illustrating an example of the feedback loop illustrated in FIG. 1A, according to one embodiment.

Embodiments of the disclosure provided herein may include a feedback loop for controlling a pulsed voltage waveform comprising a data acquisition system comprising a first input channel comprising a first conditioning circuit configured to generate a first conditioned voltage waveform from a first input voltage waveform, and a fast data acquisition module. The fast data acquisition module may include a first acquisition channel that is electrically coupled to the first conditioning circuit of the first input channel, and is configured to generate a first digitized voltage waveform from the first conditioned voltage waveform, and a data acquisition controller configured to determine one or more one-cycle waveform characteristics of the first conditioned voltage waveform by analyzing the first digitized voltage waveform. The feedback loop may further include a feedback processor configured to process the information related to the first conditioned voltage waveform processed by the fast data acquisition module. In some embodiments, the pulsed voltage waveform is established by a pulsed voltage waveform generator that is electrically coupled to a biasing electrode disposed within a substrate support assembly disposed within a plasma processing chamber.

Embodiments of the disclosure provided herein may also include a feedback loop for controlling a pulsed voltage waveform comprising a data acquisition system comprising a first input channel comprising a first conditioning circuit configured to generate a first conditioned voltage waveform from a first input voltage waveform, a second input channel comprising a second conditioning circuit configured to generate a second conditioned voltage waveform from a second input voltage waveform; and a fast data acquisition module. The fast data acquisition module may include a first acquisition channel that is electrically coupled to the first conditioning circuit of the first input channel, and is configured to generate a first digitized voltage waveform from the first conditioned voltage waveform, a second acquisition channel that is electrically coupled to the second conditioning circuit of the second input channel, and is configured to generate a second digitized voltage waveform from the second conditioned voltage waveform, and a data acquisition controller configured to determine one or more one-cycle waveform characteristics of at least one of the first and the second conditioned voltage waveforms by analyzing at least one of the first and the second digitized voltage waveforms. In some embodiments, the pulsed voltage waveform is established by a pulsed voltage waveform generator that is electrically coupled to a biasing electrode disposed within a substrate support assembly disposed within a plasma processing chamber. In some embodiments, the pulsed voltage waveform generator is also electrically coupled to the biasing electrode through an electrical conductor using a generator coupling assembly, and wherein the input end of the first input channel is electrically coupled to an end of the generator coupling assembly, and the input end of the second input channel is electrically coupled to one of an output of a current monitor and a non-grounded end of the current sense resistor, wherein the current monitor is configured to sense a current flowing in the electrical conductor and the current sense resistor is placed within a pulsed voltage waveform generator.

DETAILED DESCRIPTION

Embodiments of the disclosure provided herein include a closed feedback loop scheme that is suitable for operation with a pulsed voltage waveform generator to produce controlled and repeatable pulsed voltage waveforms. Embodiments described herein can thus be used in many different types of plasma assisted or plasma enhanced processing chambers that are used to perform plasma assisted or plasma enhanced processing of a substrate. While not intending to be limiting as to the scope of the disclosure provided herein, in some embodiments, a pulsed voltage biasing scheme is used during plasma processing to maintain a nearly constant sheath voltage for up to about 90% of the substrate processing time, which results in a single (narrow) peak IEDF that can be further used to create an IEDF with an arbitrary shape. Further, in one or more of the embodiments disclosed herein, a plasma processing method includes a pulsed voltage waveform that further includes multiple cycles, such as, for example, a periodic series of short positive pulses repeating with a period Ts (e.g., 2.5 microseconds), wherein the overall period Tp of each pulse is typically on the order of several tens of nanoseconds (e.g., 10-100 ns), and each cycle of the multiple cycles corresponds to one or more pulses.

FIG. 1A schematically illustrates a feedback loop 100 that is electrically coupled to one or more electrical components found in a plasma processing system 50. In general, the feedback loop 100 includes one or more input channels 110 and a fast data acquisition module 120. The one or more input channels 110 are electrically coupled to a fast data acquisition module 120. In some embodiments, the fast data acquisition module 120 is configured to control and maintain a generated pulsed voltage waveform, such as a high voltage nanosecond substrate voltage waveform, to control the sheath voltage and the IEDF at the substrate during plasma processing. Further, the fast data acquisition module 120 includes one or more acquisition channels 122.

An input end of one or more input channels 110 is coupled to a connection point 135 within the plasma processing system 50. Accordingly, an input pulsed voltage waveform 140, which is received and then conditioned by one or more input channels 110, can then be processed by components in the fast data acquisition module 120 and components within a feedback processor 125 so that control parameters can be provided to a pulsed waveform generator (e.g., the pulsed voltage waveform generator (PVWG) 150 of FIG. 1B) within the plasma processing system 50, to control the characteristics of a pulsed voltage waveform established at an electrode (e.g., biasing electrode disposed within a substrate support) positioned within a processing chamber of the plasma processing system 50. The one or more input channels 110 receive the input pulsed voltage waveform 140 and generate an output waveform 144 from the input pulsed voltage waveform 140. As will be described in more detail in the following description, the input pulsed voltage waveform 140 may be processed by the input channel 110 to generate the output waveform 144 that comprises a conditioned waveform. For example, the input channel 110 may condition the received input pulsed voltage waveform 140, via a conditioning circuit to generate the output waveform 144. Accordingly, for example, the amplitude and/or shape of the output waveform 144 may differ from that of the input pulsed voltage waveform 140. One will note that the characteristics of a pulsed voltage waveform received by an input channel 110 (i.e., input pulsed voltage waveform 140) can have different characteristics depending on the position of the connection point 135 relative to inductive, capacitive or resistive elements formed and/or positioned within one or more circuits coupled to the complex load 130 (FIG. 1B) of the plasma processing system 50. In some embodiments, the input channels 110 within the feedback loop 100 may each have different degrees of attenuation of the incoming signal due to differences in the types of components (e.g., voltage dividing components or filtering components) found within each of the input channels. Therefore, input channels 110 may be referred to herein as channels having a high-attenuation, a mid-attenuation, or low-attenuation, or be unattenuated, based on their degree of attenuation or conditioning of the received input pulsed voltage waveform 140.

FIG. 1B schematically illustrates an example of the feedback loop 100 shown in FIG. 1A which includes multiple input channels 110 that are each electrically coupled to corresponding acquisition channels 122 of the fast data acquisition module 120. As shown in FIG. 1B, an input channel 110 can be coupled to a connection point that is coupled to a conductive element positioned on either side of a generator coupling assembly 133, which are all used in combination to connect the output of the PVWG 150 to the complex load 130. In general, the conductive elements and generator coupling assembly 133, which are used to connect the output of the PVWG 150 to the complex load 130, are often referred to herein as being elements within a transmission line 131. Thus, the PVWG 150 is electrically connected to the complex load 130 via the transmission line 131 and a reference line 132. In general, the term "electrical conductor" or "conductor" as used herein may include: (a) a coaxial transmission line, which may include a flexible coaxial cable in series with a rigid coaxial transmission line, (b) an insulated high-voltage corona-resistant hookup wire, (c) a bare wire, (d) a metal rod, (e) an electrical connector, or (f) any combination of electrical elements in (a)-(e). While FIG. 1B schematically illustrates a configuration in which multiple input channels 110 are coupled to a connection point that is coupled to one of one or more conductive elements that are used to connect the output of the PVWG 150 to the complex load 130 and/or one or more circuits within the PVWG 150, this configuration is not intended to be limiting as to the scope of the disclosure provided herein since the number of input channels 110 and/or the number of different positions that the various input channels 110 could be connected to within the plasma processing system 50 could be increased or decreased as required to control a desired chamber processing application.

Figure 8A:
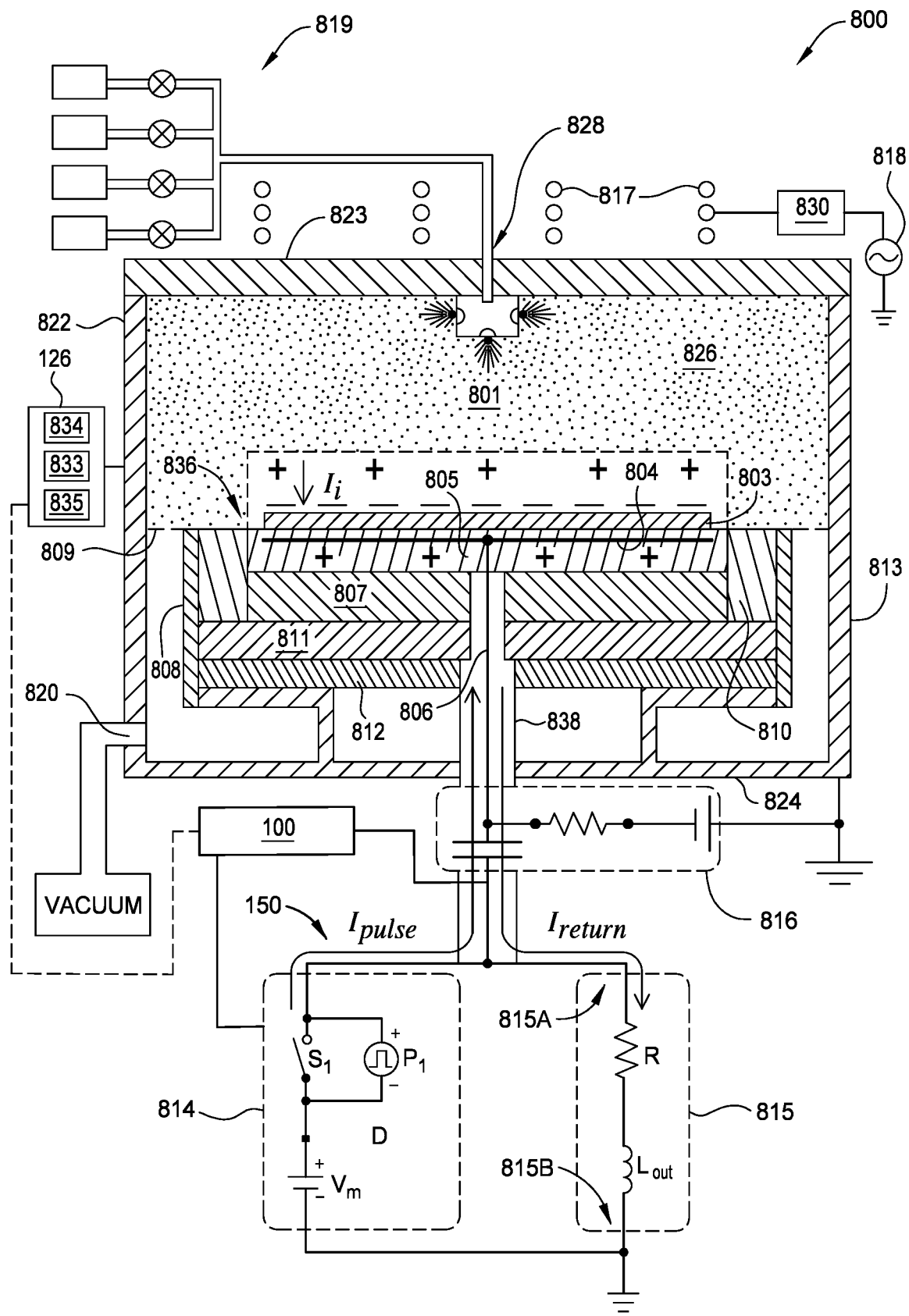
FIG. 8A is a schematic cross-sectional view of a processing chamber configured to practice methods described herein, according to one embodiment.
Figure 8B:
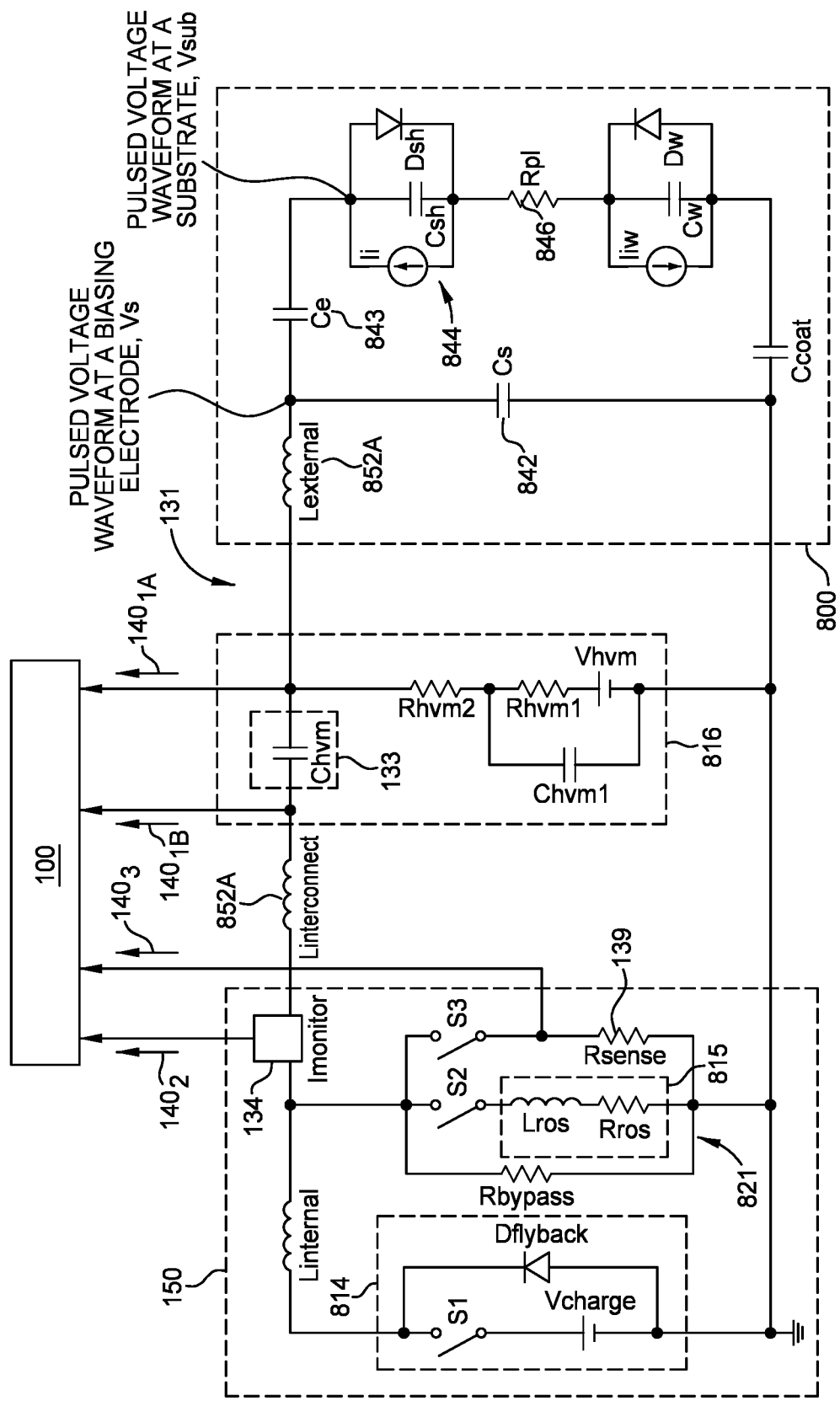
FIG. 8B is a functionally equivalent approximate circuit diagram of a pulsed voltage biasing scheme that can be used with the process chamber illustrated in FIG. 8A, according to one embodiment.

As illustrated in FIG. 1B, the plasma processing system 50 includes a pulsed voltage waveform generator (PVWG), such as the PVWG 150 of the processing chamber 800 schematically illustrated in FIGS. 8A and 8B. Further, the plasma processing system 50 includes a complex load 130, which includes and/or is formed by generating a pulsed voltage waveform at a biasing electrode (e.g., a biasing electrode 804 in FIG. 8A) during plasma processing. The feedback loop 100 is generally configured to control the pulsed voltage waveform by adjusting one or more characteristics of the generated pulsed voltage waveform generated by the PVWG 150.

One or more of the input channels 110 can include a conditioning circuit 111, such as, for example, a conditioning circuit $111_1$ in input channel $110_1$ and a conditioning circuit $111_2$ in input channel $110_2$. Further, the one or more input channels 110 are configured to generate output waveforms 144 that are conditioned. In some embodiments, the conditioning circuits 111 may each include a voltage divider (e.g., the voltage divider 112 of FIG. 2), a low pass filters 114 (e.g., the low pass filter of FIG. 3), both a voltage divider and a low pass filters 114, or even in some cases neither a voltage divider nor a low pass filters 114 which is referred to herein as an unattenuated conditioning circuit. In one example, a feedback loop 100 includes at least three conditioning circuits 111 in which one conditioning circuit includes a high-ratio voltage divider, another conditioning circuit includes a mid-ratio voltage divider, and the other conditioning circuit includes only a filter, and thus does not contain a voltage divider. In embodiments where the conditioning circuits 111 of the input channel 110 includes a voltage divider and also a low pass filter, the voltage divider 112 is electrically coupled to the low pass filter 114. Further, in such embodiments, the voltage divider generates a divided voltage waveform from an input pulsed voltage waveform 140 and the low pass filter generates a filtered voltage waveform from the divided voltage waveform. In embodiments where the low pass filter is omitted, the voltage divider generates a divided voltage waveform from the input pulsed voltage waveform 140, and the divided voltage waveform is communicated to the fast data acquisition module 120. In such embodiments, the divided voltage waveform is a conditioned voltage waveform, which is the output waveform 144. In embodiments where the voltage divider and the low pass filter are both omitted from the input channel 110, the input pulsed voltage waveform 140 is also the output waveform 144. In embodiments where the voltage divider is omitted and a low pass filter is present in the conditioning circuits 111, the low pass filter generates a filtered voltage waveform from the input pulsed voltage waveform 140, and the filtered waveform is communicated to the fast data acquisition module 120.

FIG. 1B illustrates the input channels $110_1$-$110_N$, where N is generally a number greater than one, such as a number greater than three, as shown in FIG. 1B. Each of the input channels $110_1$-$110_N$ may be connected to different points within the plasma processing system 50. For example, the input channel $110_1$ may be connected to an electrical conductor positioned on either side of a generator coupling assembly 133, which may include a blocking capacitor (e.g., capacitor $C_{hvm}$ of FIG. 8B). For example, the input channel $110_1$ is coupled between the complex load 130 and the generator coupling assembly 133, or the input channel $110_1$ is coupled between the output of the PVWG 150 and the generator coupling assembly 133. In embodiments where the input channel $110_1$ is coupled between the output of the PVWG 150 and the generator coupling assembly 133, the input channel $110_1$ receives the input pulsed voltage waveform $140_{1A}$ and the conditioning circuit $111_1$ generates the output waveform (e.g., a conditioned waveform) $144_{1A}$. In one example, a received or measured input pulsed voltage waveform $140_{1A}$ includes voltage pulses that include positive and negative voltage levels within different phases of each of the voltage pulses (i.e., pulses are above and below the dashed zero volt reference line) and high frequency oscillations within various phases of a pulse within the input pulsed voltage waveform $140_{1A}$ (e.g., see the dashed circle highlighting a region of a pulse), which when conditioned by the components, such as a voltage divider, within the conditioning circuit $111_{1A}$ forms an output waveform $144_{1A}$ that is at least provided at a lower voltage level due to the use of a voltage divider. In embodiments where the input channel $110_1$ is coupled between the complex load 130 and the generator coupling assembly 133, the input channel $110_1$ receives the input pulsed voltage waveform $140_{1B}$ and the conditioning circuit $111_1$ generates the output waveform (e.g., a conditioned waveform) $144_{1B}$. As is illustrated in FIG. 1B, input pulsed voltage waveform $140_{1A}$ has different waveform characteristics from the input pulsed voltage waveform $140_{1B}$ due to the position of their respective connection points along the transmission line 131 within the plasma processing system 50. Alternately, in one example, as shown in FIG. 1B, a received or measured input pulsed voltage waveform $140_{1B}$ includes positive voltage pulses (i.e., pulses are above the dashed zero volt reference line) that include high frequency oscillations within a phase of a pulse within the input pulsed voltage waveform $140_{1B}$ (e.g., pulse region $I_{1B}$), which when conditioned by the components, such as a voltage divider and a low pass filter found within the conditioning circuit $111_{1B}$, to form an output waveform $144_{1B}$ that is a filtered waveform that is at a reduced voltage level.

With further reference to FIG. 1B, the input channel $110_2$ is connected to a current monitor 134 within the PVWG 150 or attached to the PVWG 150. Accordingly, the input channel $110_2$ receives the input pulsed voltage waveform $140_2$ and the conditioning circuit $111_2$ generates output waveform (conditioned waveform) $144_2$. In one example, as shown in FIG. 1B, a received or measured input pulsed voltage waveform $140_2$ includes voltage pulses that include positive and negative voltage levels within different phases of each of the voltage pulses and high frequency oscillations within at least one of the phases of each pulse within the input pulsed voltage waveform $140_2$ (e.g., see the dashed circle highlighting a region of a pulse), which when conditioned by the components, such as a voltage divider and a low pass filter, within the conditioning circuit $111_2$ forms an output waveform $144_2$ that is a filtered waveform that is at a reduced voltage level.

Further, the input channel $110_3$ is connected to the current sense resistor 139 of the PVWG 150. Accordingly, the input channel $110_3$ receives the input pulsed voltage waveform $140_3$ and the conditioning circuit $111_3$ generates output waveform (conditioned waveform) $144_3$. In one example, as shown in FIG. 1B, a received or measured input pulsed voltage waveform $140_3$ includes positive voltage pulses and high frequency oscillations within at least one of the phases of each pulse within the input pulsed voltage waveform $140_3$ (e.g., see the dashed circle), which when conditioned by the components within the conditioning circuit $111_3$, such as a low pass filter, forms an output waveform $144_3$ that is a filtered waveform.

In some embodiments, additional input channels, such as input channels $110_4$-$110_N$, are connected to other connection points within the plasma processing system 50 to receive additional information about the delivered pulsed voltage waveforms and/or state of a plasma process being performed in a plasma processing chamber. Further, the conditioning circuit $111_N$ is configured to generate a corresponding output waveform $144_N$. Input channel $110_N$ receives the input pulsed voltage waveform $140_N$ and the conditioning circuit $111_N$ generates output waveform (conditioned waveform) $144_N$. Thus, any of the conditioning circuits 111, such as conditioning circuit $111_N$, may include any combination of voltage dividers 112 (FIG. 2) and low pass filters 114 (FIG. 3), or neither a voltage divider 112 nor a low pass filter 114.

As is illustrated in FIG. 1B, each of the input pulsed voltage waveforms $140_{1A}$-$140_3$ differ from each other. Accordingly, the corresponding output waveforms $144_{1A}$-$144_3$ differs from each other. Therefore, depending on the location that an input end of an input channel 110 is connected to the plasma processing system 50, the characteristics of the input pulsed voltage waveforms and output waveforms will vary accordingly, and thus the selection of a connection position of each of the input channels will have an effect on the information received by the feedback loop 100's which can affect the ability of the feedback loop 100 to control the pulsed voltage waveform.

Fast Data Acquisition Module

The fast data acquisition module 120 is generally configured to receive analog voltage waveforms (e.g., conditioned waveforms 144) and transmit digitized voltage waveforms.

The fast data acquisition module 120 includes one or more acquisition channels 122 that are each electrically coupled to a respective conditioning circuit 111 of a first input channel 110, and the fast data acquisition module 120 is configured to generate a digitized voltage waveform from a received conditioned voltage waveform (e.g., the output waveform 144), wherein a data acquisition controller 123 of the fast data acquisition module 120 is configured to determine one or more waveform characteristics of the conditioned voltage waveform (e.g., the output waveform 144) by analyzing the first digitized voltage waveform. As illustrated in FIG. 1B, the fast data acquisition module 120 comprises a plurality of acquisition channels $122_1$-$122_N$, a data acquisition controller 123 and memory 124 (e.g., non-volatile memory). Each of the acquisition channels 122 is electrically coupled to the output of a corresponding one of the input channels 110 such that an acquisition channel 122 receives an output waveform 144 from the corresponding one of the input channels 110. For example, the acquisition channel $122_1$ is electrically coupled to the output end of the input channel $110_1$ and receives either the output waveform $144_{1A}$ or $144_{1B}$, depending on the position of the connection point of input end of the input channel $110_1$. Further, the acquisition channel $122_2$ is electrically coupled to the output end of the input channel $110_2$ and receives the output waveform $144_2$. Additionally, or alternatively, the acquisition channel $122_3$ is electrically coupled to the output end of the input channel $110_3$ and receives the output waveform $144_3$. The acquisition channel $122_N$ is electrically coupled to the output end of the input channel $110_N$ and receives the output waveform $144_N$.

In some embodiments, the fast data acquisition module 120 is coupled to a feedback processor 125 via a data communication interface 125A, wherein the feedback processor 125 is configured to generate one or more control parameters using one or more waveform characteristics determined by one or more algorithms that are executed by a processor within the data acquisition controller 123. The one or more algorithms, which are stored in memory 124, include instructions, which when executed by the processor 121 in the fast data acquisition module cause the fast data acquisition module to process the output waveform 144 (e.g., conditioned voltage waveform(s)) to determine one or more waveform characteristics of the received output waveform 144. As is discussed further below, the feedback processor 125 includes memory that includes instructions, which when executed by a processor (CPU) in the feedback processor 125 cause the feedback processor 125 to generate one or more control parameters using the determined one or more waveform characteristics provided from the fast data acquisition module 120. The instructions executed by the feedback processor may also be further configured to cause the feedback processor to transmit information related to the generated one or more control parameters to the PVWG 150. The PVWG 150 may also include memory that includes instructions, which when executed by a processor in the PVWG 150 causes the PVWG 150 to establish an adjusted pulsed voltage waveform based on the one or more control parameters generated by the feedback processor 125.

As discussed above, each of the acquisition channels 122 processes a corresponding output waveform 144 output by a corresponding input channel 110 to generate a digitized voltage waveform from the output waveform. For example, the acquisition channel $122_1$ processes the output waveform $144_{1A}$ or $144_{1B}$ to generate a digitized voltage waveform. Further, the acquisition channel $122_2$ processes the output waveform $144_2$ to generate a digitized voltage waveform and the acquisition channel $122_3$ processes the output waveform $144_3$ to generate a digitized voltage waveform. Additionally, or alternatively, the acquisition channel $122_N$ processes the output waveform $144_N$ to generate a digitized voltage waveform.

The data acquisition module 120 further includes data acquisition controller 123. The data acquisition controller 123 is electrically coupled to output of each of the acquisition channels 122 and is configured to receive the digitized voltage waveform from each of the acquisition channels 122. Further, the algorithms stored within the memory 124 of the data acquisition controller 123 are adapted to determine one or more waveform characteristics of each of the conditioned waveforms (e.g., the output waveforms 144) by analyzing each of the digitized voltage waveforms. The analysis may include a comparison of information received in the digitized voltage waveform with information relating to one or more stored waveform characteristics that is stored in memory 124 and is discussed further below.

The data acquisition controller 123 can include one or more of an analog-to-digital converter (ADC) (not shown), a processor 121 (FIG. 1C), communication interface (not shown), a clock (not shown) and an optional driver (not shown). The processor may be any general computing processor. Further, the processor may be a Field Programmable Gate Array (FPGA). The ADC converts the signal within the output waveforms 144 from the analog domain to the digital domain and the output digital signal of the ADC is provided to the processor 121 for processing. The processor 121 of the data acquisition controller 123 determines the one or more waveform characteristics of the output waveform by analyzing the output digital signal provided from the ADC.

In various embodiments, the data acquisition module 120 additionally includes memory 124. The memory 124 may be any non-volatile memory. Further, the data acquisition controller 123 is electrically coupled with the memory 124 and is configured to cause waveform characteristics to be stored within the memory 124. In various embodiments, the memory 124 includes instructions executable by the data acquisition controller 123 to cause the data acquisition controller 123 to analyze the received output waveforms 144 and/or transmit information corresponding to determined waveform characteristics based on the analysis of the received output waveforms 144.

In various embodiments, the memory 124 includes one or more of a data logger 124A, a waveform analyzer 124B, and executable instructions 124C. The data acquisition controller 123 may be configured to store information corresponding to the waveform characteristics within the data logger 124A of the memory 124. For example, the data logger 124A may be include a database accessible by the data acquisition controller 123 to store information corresponding to the waveform characteristics. The waveform analyzer 1248 includes instructions executable by the data acquisition controller 123 and when executed cause the data acquisition controller 123 to analyze the output waveforms 144 to determine the waveform characteristics. The executable instructions 124C are executable by the data acquisition controller 123 and when executed cause the data acquisition controller 123 to transmit waveform characteristics or information corresponding to the waveform characteristics to one or more of the feedback processor 125, the controller 127, the controller 128, and the controller 191. In one embodiment, the executable instruction 124C, when executed by the data acquisition controller 123, cause the data acquisition controller 123 to store the waveform characteristics within the data logger 124A, and analyze the waveform characteristics with regard to one or more threshold values, among others.

The data acquisition controller 123 is configured to receive and/or analyze the digitized voltage waveforms from each of the corresponding acquisition channels 122 in parallel. Alternatively, the data acquisition controller 123 is configured to receive and/or analyze the digitized voltage waveforms from each of the corresponding acquisition channels 122 serially.

As discussed above, the data acquisition module 120 may be electrically (wired or wirelessly) coupled with a feedback processor 125. The feedback processor 125 may be any general computing processor. In some embodiments, the feedback processor 125 is generally one of: an external processor connected to the fast data acquisition module 120 via a data communication interface; an internal processor integrated within the fast data acquisition module 120; or a controller for a substrate processing chamber (e.g., processing chamber controller 126) connected to the fast data acquisition module via a data communication interface. The data acquisition module 120 may communicate information corresponding to one or more of the received output waveforms 144 to the feedback processor 125. For example, the data acquisition module 120 may communicate information related to one or more detected and/or processed waveform characteristics of the one or more of the received output waveforms 144 to the feedback processor 125. Further, the feedback processor 125 may be communicatively coupled with the plasma processing system 50. In various embodiments, as discussed above, the feedback processor 125 includes a memory or is coupled to a memory, and the memory further contains a software algorithm for instructing a processor within the feedback processor 125 to perform one or more portions of the methods described herein.

Figure 1D:
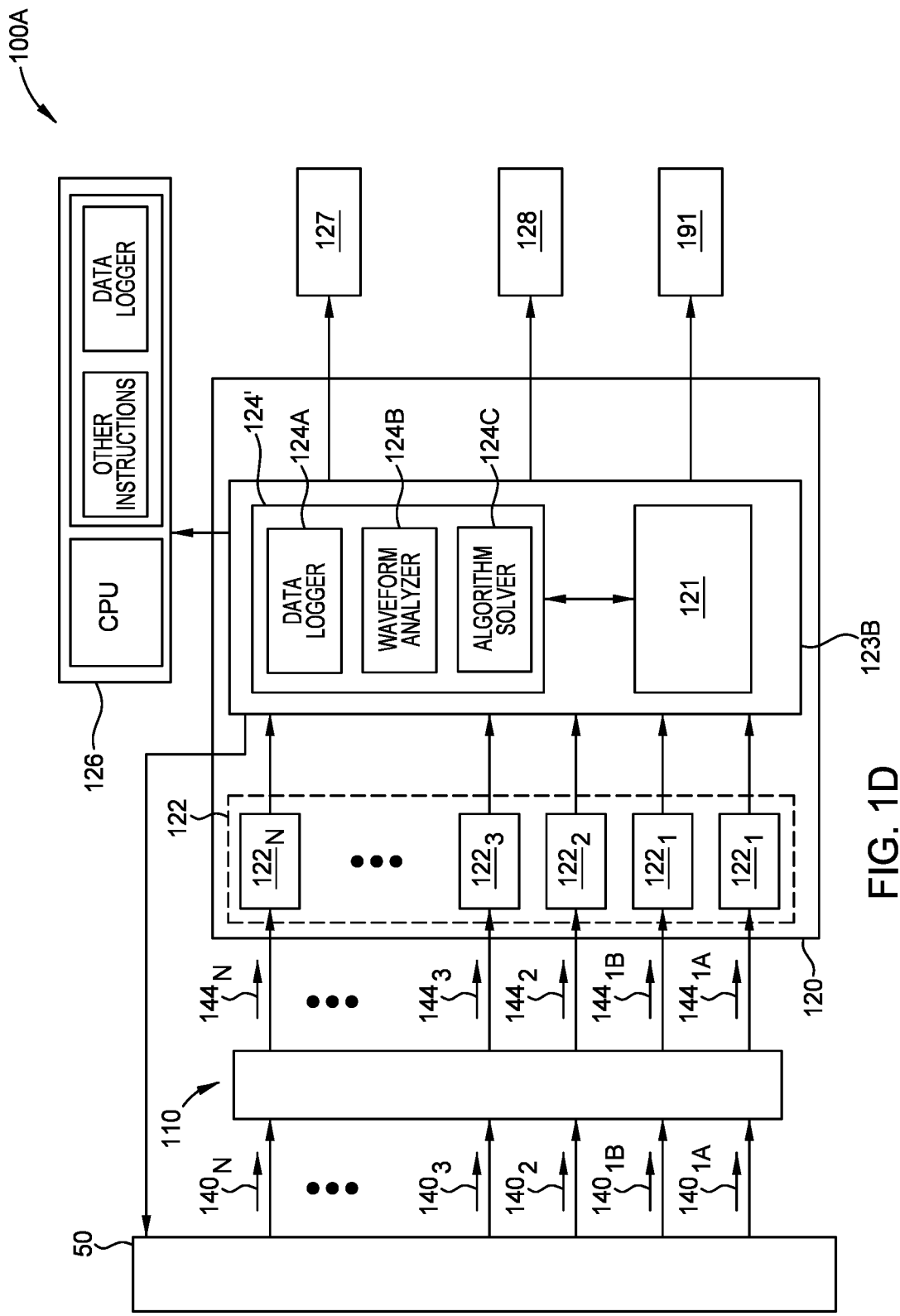
FIG. 1D is a schematic diagram illustrating an example of the feedback loop illustrated in FIG. 1A, according to one embodiment.

In one or more embodiments, the data acquisition module 120 may be electrically (wired or wirelessly) coupled with a processing chamber controller 126 of a processing chamber (e.g., the processing chamber 800 of FIG. 8A) or a processing system that includes a processing chamber. For example, the data acquisition module 120 transmits data to and/or receives data from the processing chamber controller 126 (FIG. 1D). For example, the data acquisition module 120 communicate information related to one or more waveform characteristics to the processing chamber controller 126. Further, the processing chamber controller 126 may be communicatively coupled with the plasma processing system 50. In various embodiments, the processing chamber controller 126 is omitted. The processing chamber controller 126 may separately contain a controller CPU (not shown), non-volatile memory (not shown), graphical user interface (GUI) (not shown) and other useful hardware and software components which can be coded and stored within the memory for instructing the CPU. An algorithm stored within the memory of the processing chamber controller 126 can include instructions, which when executed by the controller CPU cause various process chamber set points to be adjusted, such as a chucking voltage set point on a chucking power supply, based on the information related to one or more waveform characteristics determined by the data acquisition controller 123.

In one or more embodiments, the data acquisition module 120 is electrically (wired or wirelessly) coupled with a controller 127 that includes a removable memory device. For example, the data acquisition module 120 transmits data to and/or receives data from the controller 127. For example, the data acquisition module 120 communicates information related to one or more waveform characteristics to the removable memory device of the controller 127.

In various embodiments, the data acquisition module 120 is electrically (wired or wirelessly) coupled to an external computing device via a communication interface. The data acquisition module 120 transmits data to and/or receives data from an external computing device (e.g., a computing device external to the fast data acquisition module 120). For example, the data acquisition module 120 communicates (e.g., transmits and/or receives data) with a controller of a computing device, such as the controller 128 (FIG. 1B-1D). The data acquisition module 120 may communicate one or more detected and/or processed waveform characteristics to the controller 128. The controller 128 may be a personal computer (PC), or a mobile computing device, among others. Further, the controller 128 may be communicatively coupled (e.g., via an Ethernet connection) with the data acquisition module 120 and/or the plasma processing system 50. In various embodiment, the controller 128 is omitted.

As will be described in greater detail in the description below and description of FIGS. 5A-5D, determining one or more waveform characteristics will generally include, but is not limited to determining one or more of a period of one-cycle of a pulse ($T_{cycle}$), a rise time of a pulse ($T_{rise}$), a fall time of a pulse ($T_{fall}$), offset of a pulse from a reference voltage (e.g., zero volts), an amplitude of pulse, a pulse width, a direct current (DC) voltage offset and a pulse waveform characteristic created during one or more of the phases of a pulse voltage waveform, such as the ion current phase (also referred to herein as the "ion current" waveform characteristic). Additionally, or alternatively, determining one or more waveform characteristics comprises determining waveform characteristics of a burst of pulses (e.g., $T_{on}$ period, $T_{off}$ period), as illustrated in FIG. 7B.

FIG. 1C illustrates a portion of a feedback loop 100A, according to one or more embodiments. The feedback loop 100A is configured similar to that of the feedback loop 100 of FIG. 1B. For example, the feedback loop 100A includes fast data acquisition module 120 including the acquisition channels 122, the data acquisition controller 123A, and the memory 124. However, as compared to the feedback loop 100 of FIG. 1B, the feedback processor 125 may be integrated within a processing chamber controller 126. The integrated feedback processor 125, in this case, may include a processor 126B and a memory 126A, which includes a data logger and an algorithm solver (e.g., software instructions for determining control parameters). In the configuration illustrated in FIG. 1C, the feedback loop 100 may not include an individual feedback processor 125, since the functions of the feedback processor 125 are carried out by the components within a processing chamber controller 126.

FIG. 1D illustrates a portion of a feedback loop 100B, according to one or more embodiments. The feedback loop 100B is configured similar to that of the feedback loop 100 of FIG. 1B. For example, the feedback loop 100B includes fast data acquisition module 120 including the acquisition channels 122, and the memory 124'. However, as compared to the feedback loop 100 of FIG. 1B, the feedback loop 100B does not include the feedback processor 125. For example, in the embodiment of FIG. 1D, the data acquisition controller 123B comprises the functionality of the data acquisition controller 123 of FIG. 1B and the feedback processor 125 of FIG. 1B. In such an embodiment, the data acquisition controller 123B functions to both analyze the output waveforms 144 to determine the waveform characteristics and to determine and communicate control parameters to the PVWG 150.

In one or more embodiments, a data acquisition controller 123 is coupled to a monitor 129 within a controller 191 via a digital interface. For example, the data acquisition controller 123 is coupled to the controller 191 and monitor 129 via a digital visual interface (DVI), a high-definition multimedia interface (HDMI), or a video graphics array (VGA), among others. The data acquisition controller 123 communicates information corresponding to one or waveform characteristics to the monitor 129 to be displayed on the monitor 129 for viewing by a user.

Figure 2:
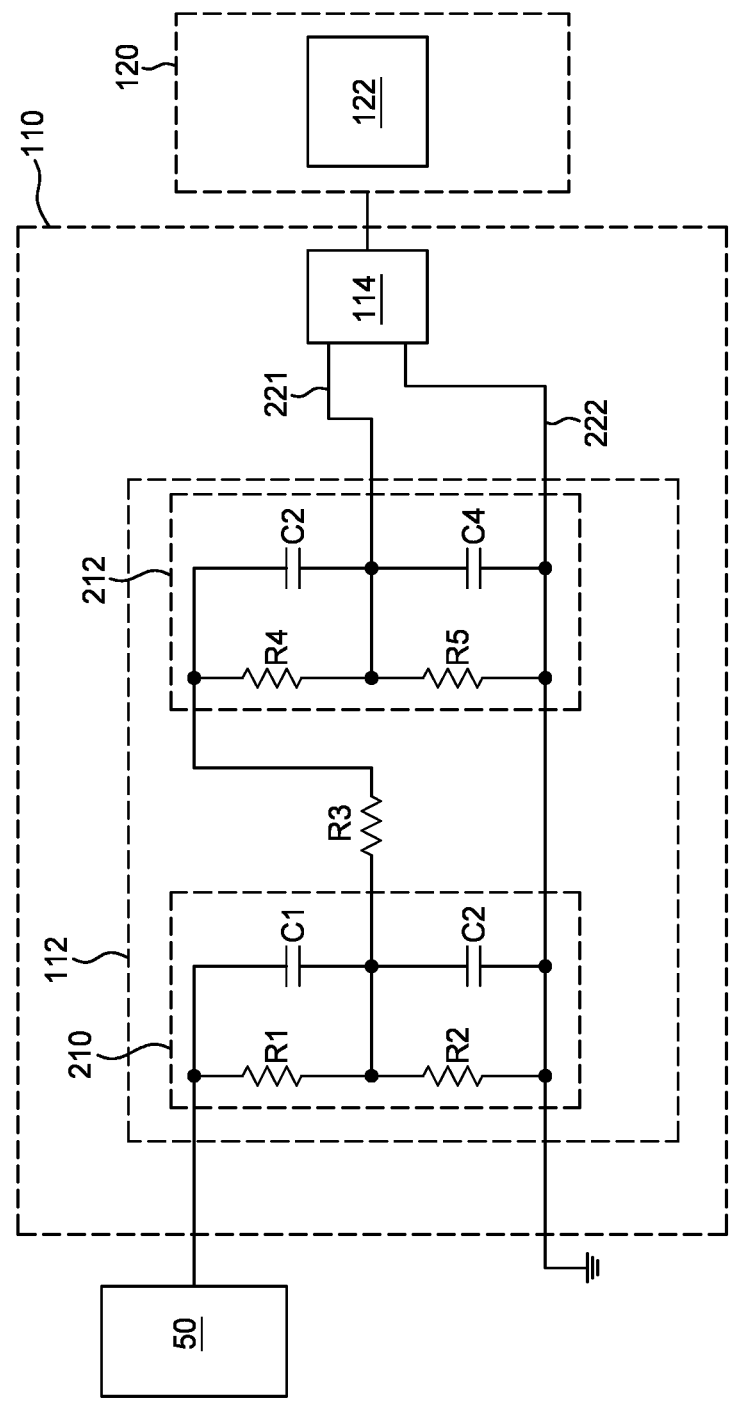
FIG. 2 is a schematic illustration of a voltage divider that can be disposed within a feedback loop, according to one or more embodiments.

FIG. 2 is a schematic illustration of a voltage divider (e.g., the voltage divider 112) of a conditioning circuit 111, according to one or more embodiments. As illustrated in FIG. 2, the voltage divider 112 may include a first cascade voltage divider 210 and a second voltage divider cascade 212. The voltage divider 112 is electrically coupled to a low pass filter 114 via one or more electrical connections, such as signal line 221 and ground reference line 223. The first cascade voltage divider 210 includes resistor R1, resistor R2, capacitor C1, and capacitor C2. The second cascade voltage divider 212 includes resistor R4, resistor R5, capacitor C3, and capacitor C4. The resistance of resistor R1, the resistance of resistor R2, the capacitance of capacitor C1, and the capacitance of capacitor C2 are selected to generate a first voltage divider ratio. For example, the first voltage divider ratio may be in a range of about 20 to 1 to about 60 to 1. Further, the resistance of resistor R1 is greater than the resistance of resistor R2 and the capacitance of capacitor C2 is greater than the capacitance of capacitor C1. For example, the resistance of resistor R1 may be about 950 kilo-ohms and the resistance of resistor R2 may be about 20 kilo-ohms. Alternatively, the resistance of resistor R1 may be less than or greater than 950 kilo-ohms and the resistance of resistor R2 may be less than or greater than 20 kilo-ohms. Additionally, the capacitance of capacitor C2 may be about 650 pF and the capacitance of capacitor C1 may be about 15 pF. Alternatively, the capacitance of capacitor C2 may be less than or greater than 650 pF and the capacitance of capacitor C1 may be less than or greater than 15 pF.

The resistance of resistor R4, the resistance of resistor R5, the capacitance of capacitor C3, and the capacitance of capacitor C4 are selected to generate a second voltage divider ratio of the second voltage divider cascade 212. In some embodiments, the second voltage divider ratio is greater than the first voltage divider ratio. For example, the second voltage divider ratio may be in a range of about 80 to 1 to about 120 to 1. Further, the resistance of resistor R4 is greater than the resistance of resistor R5 and the capacitance of capacitor C4 is greater than the capacitance of capacitor C1. For example, the resistance of resistor R4 may be about 1000 kilo-ohms and the resistance of resistor R5 may be about 10 kilo-ohms. Alternatively, the resistance of resistor R4 may be less than or greater than 1000 kilo-ohms and the resistance of resistor R5 may be less than or greater than 10 kilo-ohms. Additionally, the capacitance of capacitor C4 may be about 1.5 nF and the capacitance of capacitor C3 may be about 15 pF. Alternatively, the capacitance of capacitor C4 may be less than or greater than 1.5 nF and the capacitance of capacitor C3 may be less than or greater than 15 pF.

In some embodiments, the first cascade voltage divider 210 is coupled to the second cascade voltage divider cascade 212 via resistor R3. The resistance of resistor R3 can be, for example, about 200 kilo-ohms. Alternatively, the resistance of resistor R3 may be greater than or less than about 200 kilo-ohms. The resistor R3 may filter out high frequencies from the input pulsed voltage waveform 140. The voltage divider ratio of the voltage divider 112 may be varied by altering the value of the capacitors C1-C4 and the resistors R1, R2, R4, and R5. For example, increasing the difference between R1 and R2 and C1 and C2 and/or increasing the difference between R4 and R5 and C3 and C4 increases the voltage divider ratio and decreasing the difference between R1 and R2 and C1 and C2 and/or decreasing the difference between R4 and R5 and C3 and C4 decreases the voltage divider ratio. In some embodiments, the first voltage divider cascade 210 has a dividing ratio in a range of about 10 to 1 to about 100 to 1, and the second voltage divider cascade 212 has a dividing ratio in a range of about 20 to 1 to about 120 to 1.

Figure 4:
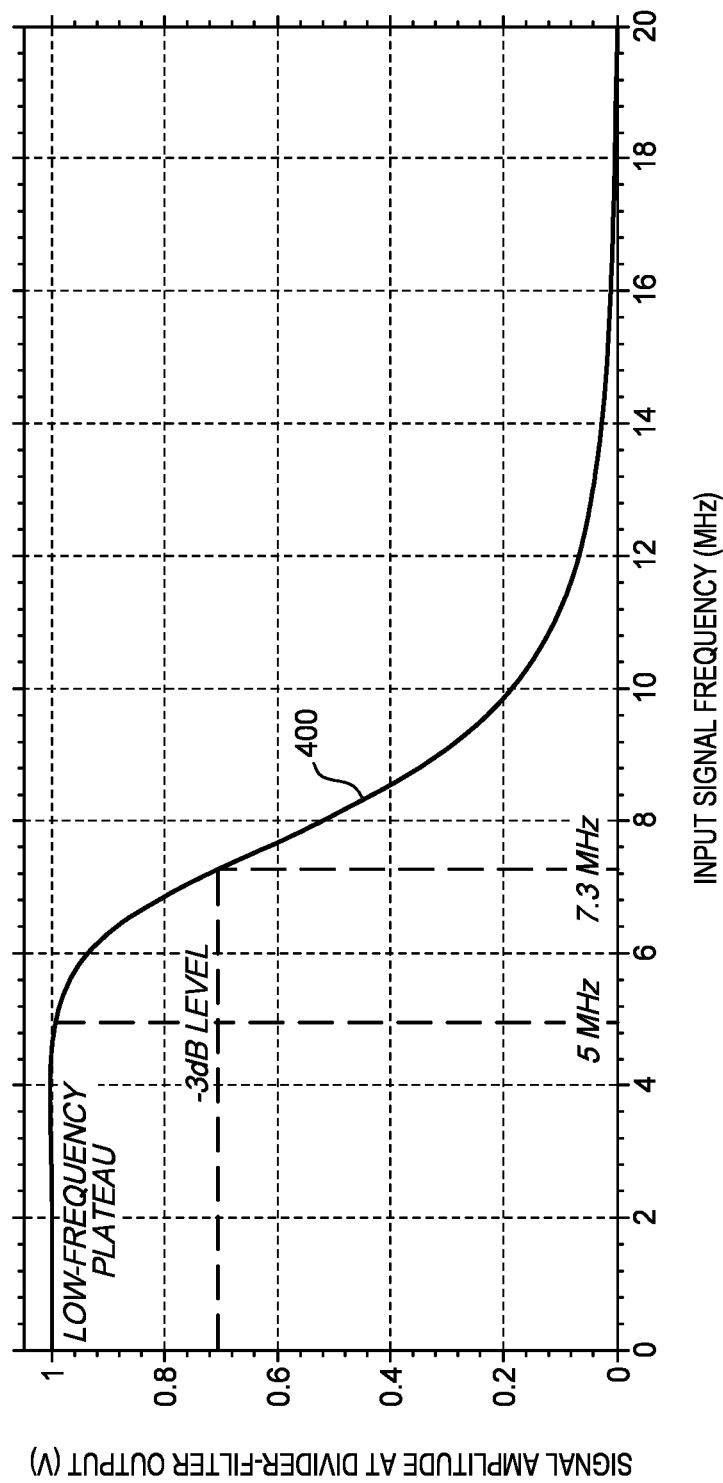
FIG. 4 illustrates a frequency response curve of the low pass filter illustrated in FIG. 3, according to one embodiment.

In embodiments where the input channel 110 includes the voltage divider 112 and the low pass filter 114, the input of the low pass filter 114 is electrically coupled to the output of the voltage divider 112 such that the low pass filter 114 receives the divided voltage waveform from the voltage divider 112. Further, the low pass filter 114 has a frequency response curve comprising a plateau and a cut-off frequency. For example, the filter response of the low pass filter 114 has a plateau at frequencies less than a bandwidth frequency of about −3 dB. The plateau of the low pass filter 114 is in a range of DC to about 7 MHz and the cut-off frequency is in a range of about 5 MHz to about 10 MHz. FIG. 4 illustrates an example of a frequency response curve (e.g., frequency response curve 400) of a low pass filter 114. As illustrated, the filter response curve has a plateau at frequencies less than the bandwidth (e.g., −3 dB) frequency of about 7.3 MHz. Alternatively, the bandwidth frequency may be greater than or less than about 7.3 MHz.

Figure 3:
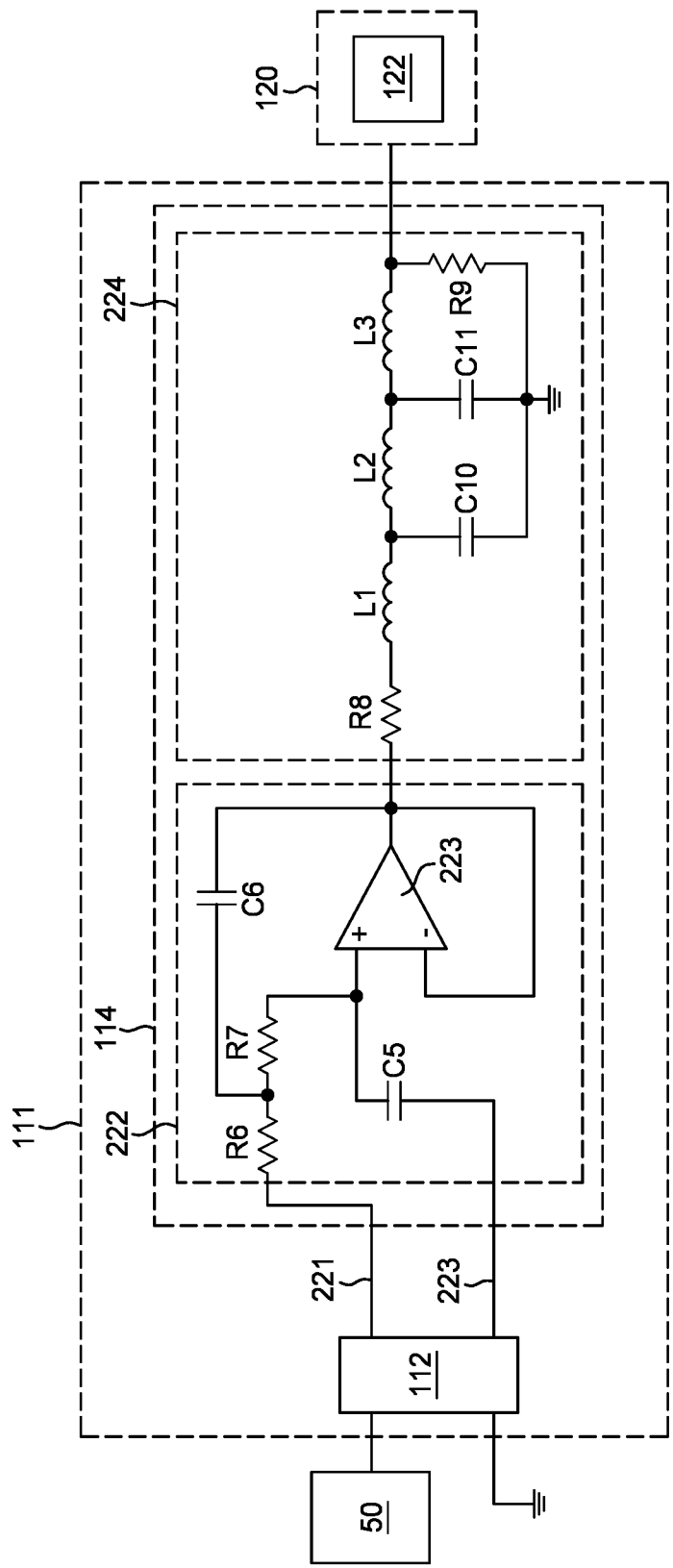
FIG. 3 is a schematic illustration of a low pass filter that can be disposed within a feedback loop, according to one or more embodiments.

FIG. 3 is a schematic illustration of a low pass filter (e.g., the low pass filter 114) of the conditioning circuit 111, according to one or more embodiments. As illustrated in FIG. 3, the low pass filter 114 includes a filter cascade 222 and a filter cascade 224. The filter cascade 222 may be a 2-stage Chebyshev filter. For example, the filter cascade 222 may be a 2-stage Chebyshev filter having a stop band attenuation of about 0.1 dB. Alternatively, 2-stage Chebyshev filters having a stop band attenuation of less than or greater than 0.1 dB may be utilized. The filter cascade 222 comprises resistors R6, R7, capacitors C6 and C5 and operational amplifier 225. The resistance of the resistors R6 and R7 may be the same. For example, the resistance of resistors R6 and R7 may be about 50 ohms. However, other resistance values may be utilized. Further, in one example, the capacitance of capacitor C6 may be about 360 pF and the capacitance of capacitor C5 may be about 147 pF. However, other capacitance values may be utilized. Additionally, the filter cascade 222 may have a cut-off frequency of about 15 MHz. Alternatively, the filter cascade 222 may have a cut-off frequency of less than or greater than about 15 MHz.

An input of the filter cascade 224 is electrically coupled to the output of the filter cascade 222. The filter cascade 224 is an LCL filter cascade. Further, the filter cascade 224 may be a 5th order Butterworth filter. Additionally, the filter cascade 224 may have a cut-off frequency less than the cut-off frequency of the filter cascade 222. For example, the filter cascade 224 may have a cut-off frequency of about 7.3 MHz. Alternatively, the filter cascade 224 may have a cut-off frequency of less than or greater than about 7.3 MHz. The filter cascade 224 includes resistors R8, R9, inductors L1, L3, and L3, and capacitors C10 and C11. The resistance of resistor R8 may be about 400 kilo-ohms; however, other resistance values may be utilized. Further, the inductance of inductor L1 may be about 5.4 uH, the inductance of inductor L2 may be about 17.5 uH, and the inductance of inductor L3 may be about 5.4 uH. However, other inductance values may be utilized. Additionally, the inductance of the inductor L2 is greater than that of inductor L1 and L2. Further, the inductance of inductor L1 may be equal to the inductance of inductor L3. The capacitance of the capacitors C10 and C11 may be the same. For example, the capacitance of the capacitors C10 and C11 may be about 88 pF. However, other capacitance values may be utilized. Further, the resistance of resistors R8 and R9 may be about 400 kilo-ohms. However, other resistance values may be used.

In some embodiments, the filter cascade 222 and filter cascade 224 each have a frequency response curve comprising a plateau and a cut-off frequency, wherein the plateau is between 1 MHz and about 7 MHz, and the cut-off frequency is in a range of about 5 MHz to about 10 MHz.

FIGS. 5A, 5B, 5C, and 5D illustrate output waveforms (i.e., conditioned waveforms) $144_{1A}$, $144_{1B}$, $144_2$, and $144_3$, respectively. The output waveforms illustrated in FIGS. 5A, 5B, 5C, and 5D include a periodic series of short pulses repeating with a period "$T_{cycle}$" (e.g., 2.5 microseconds), on top of a voltage offset. In one plasma processing example, as is discussed below, the short pulse forms only about 10% of the period "$T_{cycle}$".

As briefly discussed above, and shown FIG. 5A, the output waveform $144_{1A}$ may be analyzed by the acquisition channel $122_1$ to determine the waveform characteristics including one or more of a period of one-cycle of a pulse ($T_{cycle}$), a rise time of a pulse ($T_{rise}$), a fall time of a pulse ($T_{fall}$), and DC voltage offset of a pulse from a reference voltage (e.g., zero volts). In one embodiment, the conditioning circuit $111_{1A}$ of the input channel $110_1$, which is coupled to the biasing electrode 804 (FIG. 8A) side of the generator coupling assembly 133, only includes a voltage divider 112, which is used to form the output waveform $144_{1A}$. In this configuration, due to the absence of the low pass filter 114, a correct determination of the pulse timing characteristics (e.g., period, rise time, fall time, etc.) can be achieved. Also, in some embodiments, a chucking force applied to a substrate, by use biasing electrode 804 (FIG. 8A) and high DC voltage power supply $V_{hvm}$ of a HVM 816 (FIG. 8B), can also be determined by measuring the difference between the DC voltage on biasing electrode 804 (FIG. 8A) and the substrate 803.

Figure 5A:
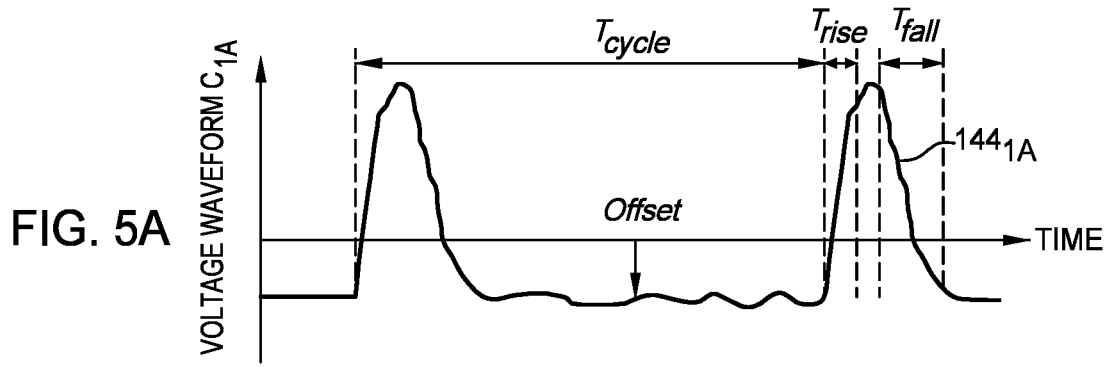
FIGS. 5A, 5B, 5C and 5D illustrate examples of conditioned voltage waveforms generated by components within the feedback loop, according to one or more embodiment.
Figure 5B:
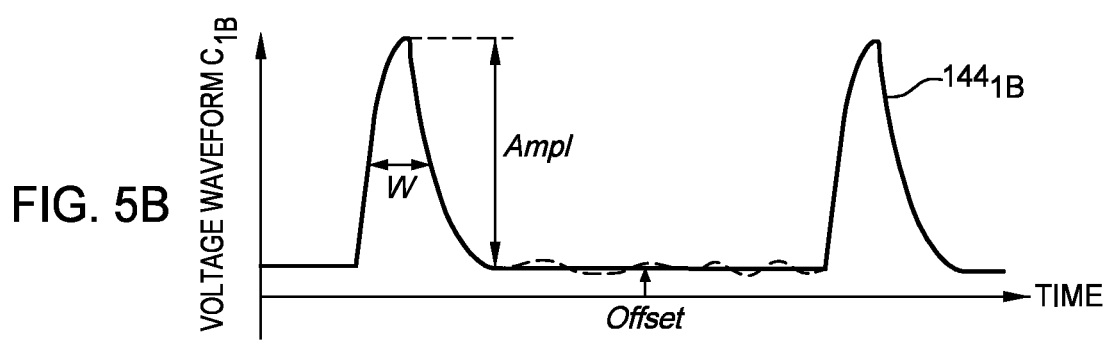

Further, as illustrated in FIG. 5B, the output waveform $144_{1B}$ may be analyzed by the acquisition channel $122_1$ to determine the waveform characteristics including amplitude "Ampl" of a pulse, pulse width "W", and DC voltage offset. The determined pulse width "W" can equal the full width at half maximum. In one embodiment, the conditioning circuit $111_{1B}$ of the input channel $110_1$, which has an input end of the input channel $110_1$ coupled to the generator side of the generator coupling assembly 133, includes a voltage divider 112 and a low pass filter 114, which are used to form the output waveform $144_{1B}$. In this configuration, a determination of the sheath voltage ($V_{sh}$) (FIG. 10B) and ion energy (E) can be achieved during plasma processing by the prior determination of a scaling factor ($\alpha$), wherein the $E_i \approx V_{sh} \approx \alpha \cdot$"Ampl". Also, in some embodiments, a chucking force applied to a substrate can be determined by measuring the difference between the DC voltage on the biasing electrode 804 (FIG. 8A) and the substrate 803. Also, characteristics of an ion current ($I_{ion}$) generated within an ion current phase of a pulse waveform can be determined, which is discussed further below.

Figure 5C:
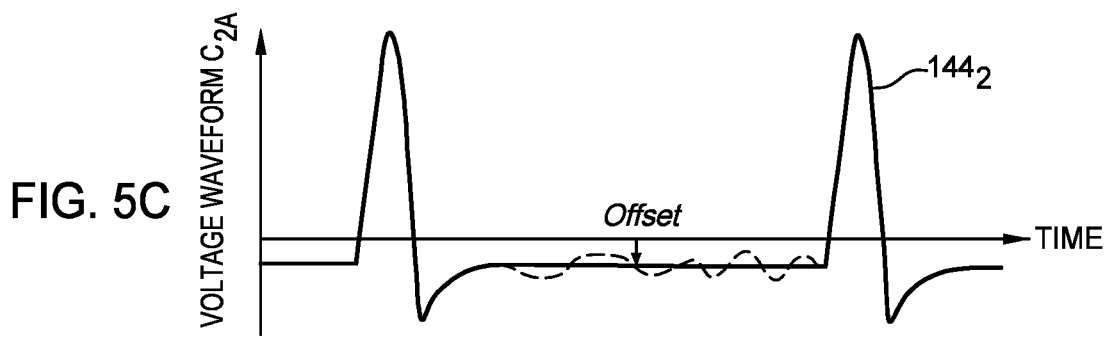
Figure 5D:
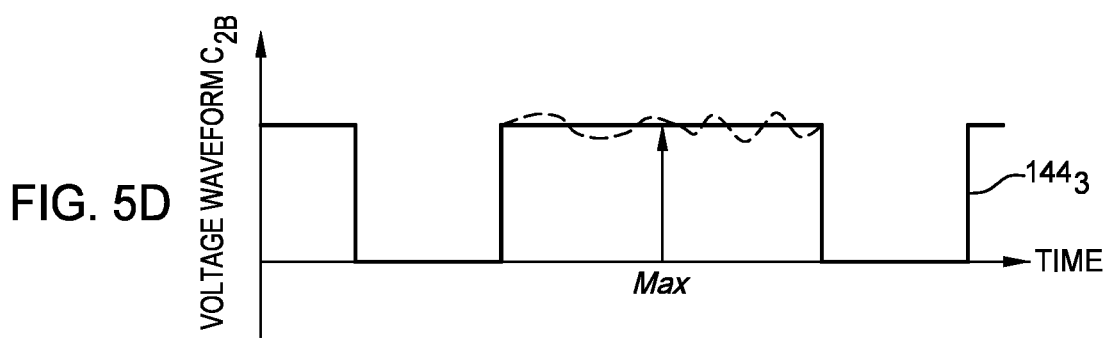

As illustrated in FIG. 5C, the output waveform $144_2$ may be analyzed by the acquisition channel $122_2$ to determine the waveform characteristics including an ion current offset. In one embodiment, the conditioning circuit $111_2$ of the input channel $110_2$, which has an input end of the input channel $110_2$ coupled to a current monitor 134 (FIGS. 1B and 9B), includes a voltage divider 112 and a low pass filter 114, which are used to form the output waveform $144_2$. In this configuration, a determination of information relating to the ion current offset can be achieved during plasma processing by use of the equation $I_{ion}$=(Ion Current Offset)/factor, where "$I_{ion}$" is the ion current and "factor" is the volts-per-amp output characteristic of the current monitor 134.

Additionally, or alternatively, the output waveform $144_3$ (FIG. 5D) may be analyzed by the acquisition channel $122_3$ to determine the waveform characteristics including a maximum ion current during plasma processing. In one embodiment, the conditioning circuit $111_3$ of the input channel $110_3$, which has an input end of the input channel $110_3$ coupled to a current sense resistor 139 within a PVWG 150, only includes a low pass filter 114, which is used to form the output waveform $144_3$. In this configuration, due to the absence of the voltage divider 112, a correct determination of the magnitude of ion current ($I_{ion}$) can be achieved. A determination of the maximum ion current "Max" can be achieved during plasma processing by use of the equation $I_{ion}$=(Max)/$R_{sense}$, where "$R_{sense}$" is the value of the $R_{sense}$ resistor.

The feedback processor 125 may receive information regarding one or more of waveform characteristics from the fast data acquisition module 120 and generates corresponding control parameters. The feedback processor 125 communicates the control parameters to the PVWG 150 and the PVWG 150 adjusts the pulsed voltage waveform established on the complex load 130 based on the received control parameters. For example, the PVWG 150 may increase an amplitude and/or width of the pulse voltage waveform established on the complex load 130 based on the received control parameters. Adjusting the parameters utilized to generate the pulsed voltage waveform can be used to mitigate undesirable changes or process variable drift within the processing chamber during substrate processing. For example, adjusting the parameters utilized to generate the pulsed voltage waveform may mitigate changes to the sheath voltage and the ion energy distribution function at the substrate during plasma processing, which are discussed in more detail below. Changes to the sheath voltage ($V_{sh}$) and the ion energy distribution function may occur in response to changes in the load, drifts in the plasma density, changes to the condition of the chamber walls, substrate temperature, and/or degree and state of chemical dissociation.

With further reference to FIG. 1B, the PVWG 150 establishes a pulsed voltage waveform on the complex load 130 via the generator coupling assembly 133. The PVWG 150 may establish the pulsed voltage waveform based on control parameters derived from the waveform characteristics (e.g., amplitude, pulse width, DC offset and ion current) determined by the data acquisition module 120. In the simplest case, the waveform characteristics determined by the data acquisition module 120 may be provided to a user (e.g., displayed on a monitor of the controller 127), which then adjusts the control parameters used by the PVWG 150 to improve the pulsed waveform characteristics of one or more pulse waveforms generated by the PVWG 150 based on the determined waveform characteristics. The control parameters may alternately be received from the feedback processor 125, the controller 128, or the processing chamber controller 126. The control parameters may include information that are used by the PVWG 150 to form a subsequently generated adjusted pulse voltage waveform, and the control parameters may include, but are not limited to one or more of: the determined one or more waveform characteristics of the first conditioned voltage waveform have reached their target values or limits; a maximum limit of a DC charge voltage is reached; a maximum power limit is reached; a maximum time limit for algorithm convergence is reached; a maximum limit of a pulse width is reached; and a minimum limit of a pulse width is reached. The control parameters may be communicated to the PVWG 150 at a predetermined rate. The predetermined rate may be about 10 transmissions per second. Alternatively, the predetermined rate may be less than or greater than 10 transmissions per second.

Additionally, or alternatively, the processing chamber controller 126 may receive one or more waveform characteristics from the fast data acquisition module 120 and then generate corresponding control parameters. The processing chamber controller 126 may communicate the control parameters to the PVWG 150. Alternatively, the processing chamber controller 126 may communicate the control parameters to the feedback processor 125, and the feedback processor 125 communicates the control parameters to the PVWG 150. The PVWG 150 adjusts the input pulsed voltage waveform 140 output by the PVWG 150 based on the determined control parameters. The PVWG 150 may increase an amplitude and/or width of the pulse voltage waveform output by the PVWG 150. Further, the processing chamber controller 126 may be configured to provide target amplitude and pulse width, as well as values for control parameters at least once per process recipe. Additionally, the fast data acquisition module 120 may communicate one or more of the amplitude, the pulse width, and the DC offset of the output waveform 144 at a transmission rate. For example, the transmission rate may be about 10 transmissions per second. However, transmission rates of greater than or less than 10 transmissions per second may be utilized.

Additionally, or alternatively, the controller 128 may receive one or more of the amplitude, the pulse width, the DC offset and an ion current from the fast data acquisition module 120 and then generate corresponding control parameters. Alternatively, the fast data acquisition module 120 may communicate a processed waveform to the controller 128, and the controller 128 may determine one or more control parameters from the waveform. The controller 128 communicates the control parameters to the PVWG 150, and the PVWG 150 adjusts the pulsed voltage waveform output by the PVWG 150 based on the determined control parameters. Alternatively, the controller 128 communicates the control parameters to the feedback processor 125, which transmits the control parameters to the PVWG 150, and the PVWG 150 adjusts the pulsed voltage waveform output by the PVWG 150 based on the determined control parameters.

Figure 6A:
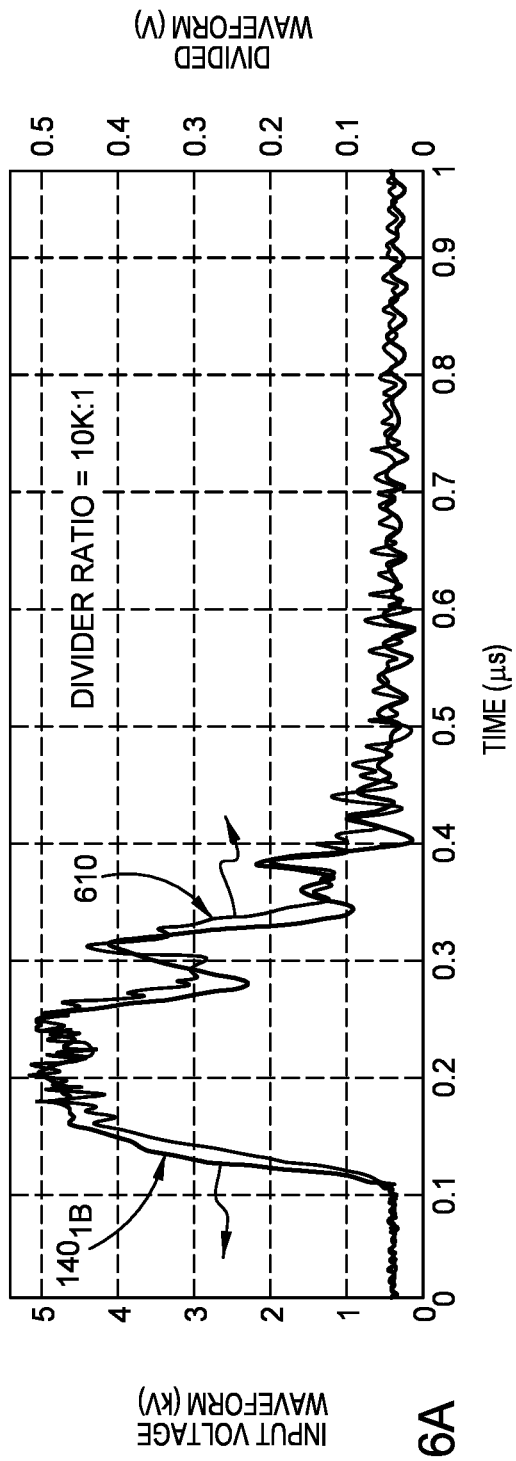
FIGS. 6A and 6B illustrate examples of different types of measured voltage waveforms, according to one embodiment.
Figure 6B:
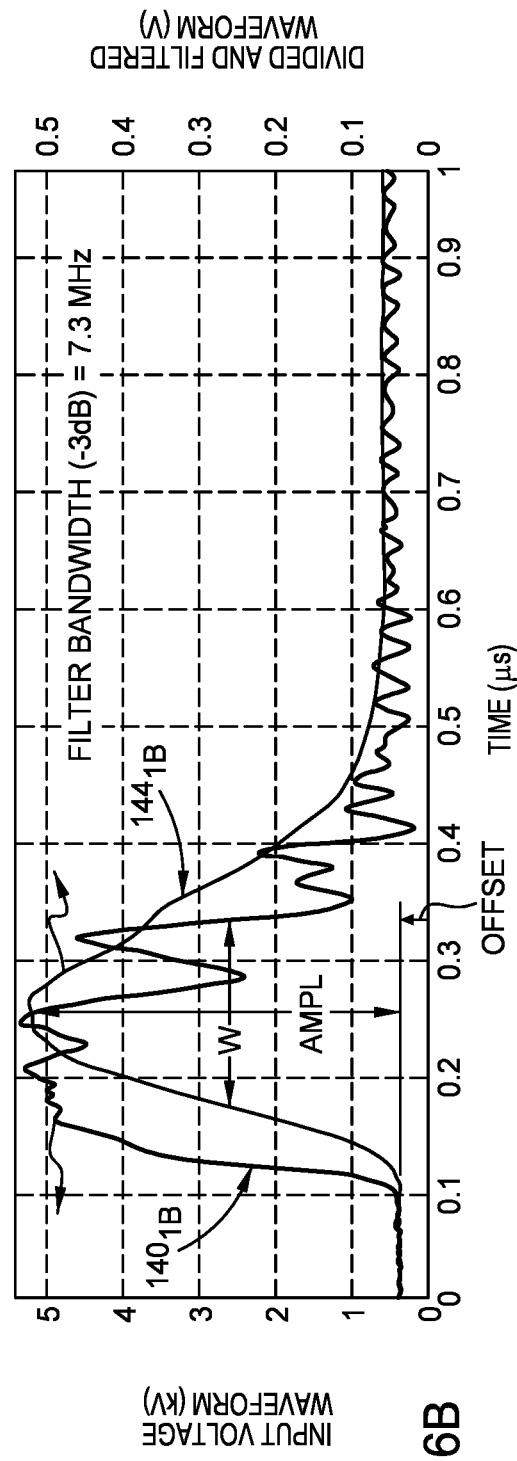

FIGS. 6A and 6B include examples of a portion of one waveform cycle of input and conditioned (e.g., divided and filtered) voltage waveforms originating from the signal source 1B (generator end of the generator coupling assembly), measured using an embodiment of a data acquisition system comprising a conditioning circuit and a fast data acquisition module. Digital information contained in a portion of a waveform recorded over this length of time can be analyzed by a data acquisition controller 123 to determine voltage waveform characteristics, such as amplitude (Ampl), full width at half maximum (W), and offset. Specifically, FIG. 6A illustrates a portion of one waveform cycle of the input pulsed voltage waveform $140_{1B}$ and a divided waveform 610. The divided waveform may generated by voltage dividing the input pulsed voltage waveform $140_{1B}$. For example, with reference to FIG. 1B, the voltage divider of the conditioning circuit $111_{1B}$ voltage divides the input pulsed voltage waveform $140_{1B}$. FIG. 6B illustrates a portion of one waveform cycle of the input pulsed voltage waveform $140_{1B}$ and the output waveform $144_{1B}$. The output waveform $144_{1B}$ may be generated by low pass filtering the divided waveform 610 (FIG. 6A). In various embodiments, the output waveform $144_{1B}$ may be analyzed by the data acquisition controller 123 to determine one or more waveform characteristics.

Figure 7A:
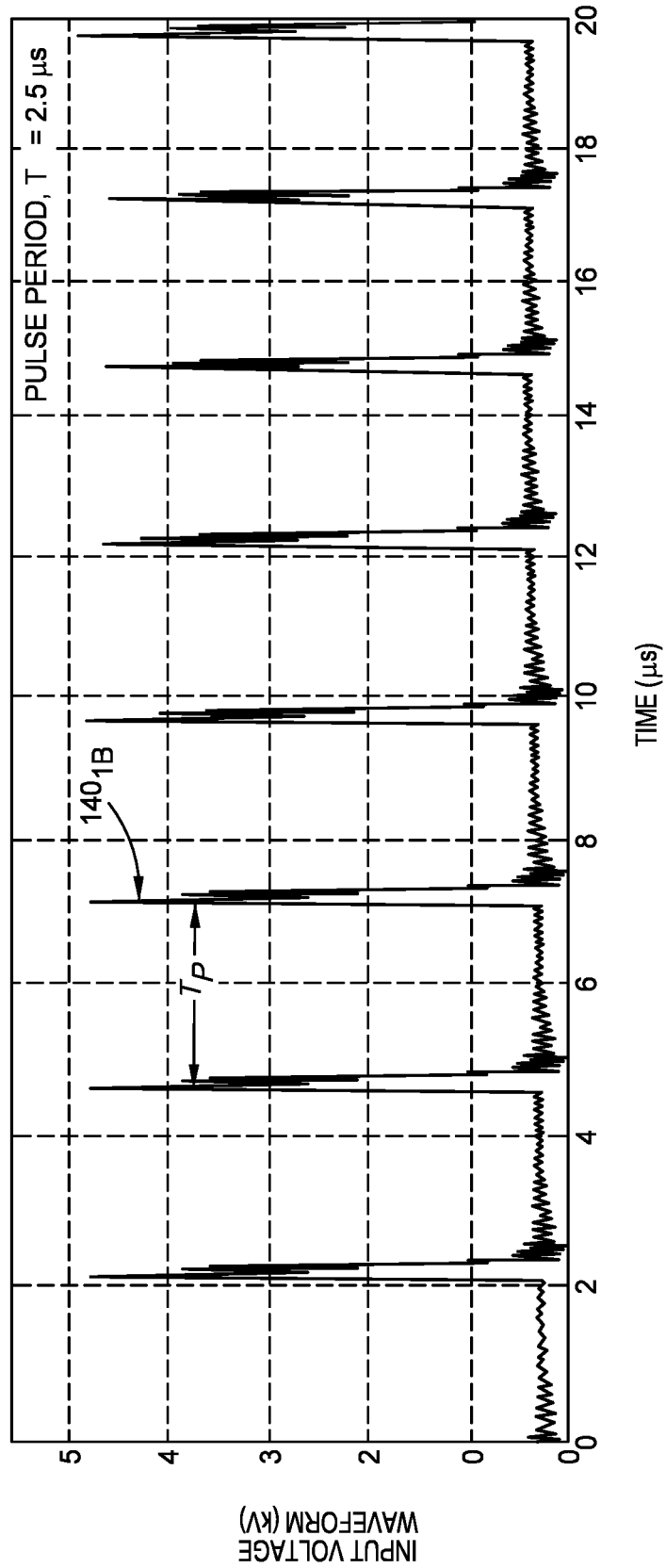
FIG. 7A illustrates an example of a series of measured voltage waveforms, according to one or more embodiments.
Figure 7B:
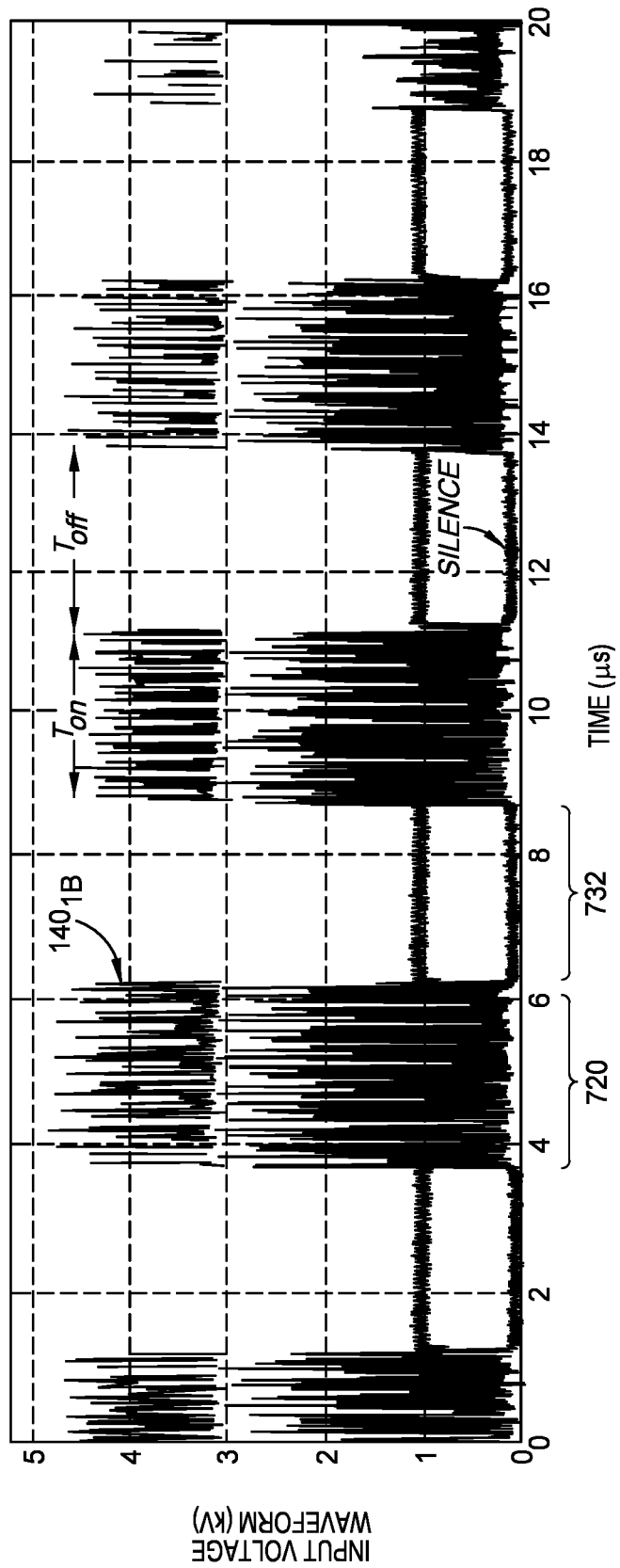
FIG. 7B illustrates an example of a series of measured voltage waveform bursts, according to one or more embodiments.

FIG. 7A illustrates multiple cycles of the input pulsed voltage waveform $140_{1B}$. More specifically, FIG. 7A includes an example of multiple cycles (pulses) of an input voltage waveform originating from the signal source 1B (generator end of the generator coupling assembly), measured using an embodiment of a data acquisition system comprising a conditioning circuit and a fast data acquisition module. As is described with regard to FIG. 1B, the input pulsed voltage waveform $140_{1B}$ may be received by the input channel $110_{1B}$ and analyzed by the acquisition channel $120_1$ to determine one or more waveform characteristics. Digital information contained in a waveform recorded over this length of time can be analyzed by a data acquisition controller 123 to determine such voltage waveform characteristics as amplitude (Ampl), offset (offset), a pulse period ($T_P$), and a pulse repetition frequency ($f_P=1/T_P$).

FIG. 7B illustrates multiple bursts 710 of the input pulsed voltage waveform $140_{1B}$. Each of the bursts 710 has a burst period including an on time 720 and an off time 732. Further, the frequency of the input pulsed voltage waveform $140_{1B}$ is based on the burst period and the burst duty cycle is based on the on time 720 and the burst period. More specifically, FIG. 7B includes an example of multiple bursts (each containing a plurality of waveform cycles) of an input pulsed voltage waveform originating from the signal source 1B (generator end of the generator coupling assembly), measured using an embodiment of a data acquisition system comprising a conditioning circuit and a fast data acquisition module. Digital information contained in a waveform recorded over this length of time can be analyzed by a data acquisition controller to determine such voltage waveform characteristics as offset (of f set), a burst period ($T_B=T_{on}+T_{off}$), a burst frequency ($f_B=1/T_B$), and a burst duty cycle (Duty=$T_{on}/T_B$).

Plasma Processing Chamber Example

FIG. 8A is a schematic cross-sectional view of a processing chamber 800, in which the complex load 130 is formed during plasma processing. The processing chamber 800 is configured to practice the biasing schemes proposed herein, according to one embodiment. In one embodiment, the processing chamber is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber. Herein, the processing chamber includes an inductively coupled plasma (ICP) source electrically coupled to a radio frequency (RF) power supply. In other embodiments, the plasma source is a capacitively coupled plasma (CCP)

source, such as a source electrode disposed in the processing volume facing the substrate support, wherein the source electrode is electrically coupled to an RF power supply.

The processing chamber 800 features a chamber body 813 which includes a chamber lid 823, one or more sidewalls 822, and a chamber base 824 which define a processing volume 826. A gas inlet 828 disposed through the chamber lid 823 is used to provide one or more processing gases to the processing volume 826 from a processing gas source 819 in fluid communication therewith. Herein, a plasma generator is configured to ignite and maintain a processing plasma 801 from the processing gases includes one or more inductive coils 817 disposed proximate to the chamber lid 823 outside of the processing volume 826. The one or more inductive coils 817 are electrically coupled to an RF power supply 818 via an RF matching circuit 830. The plasma generator is used to ignite and maintain a processing plasma 801 using the processing gases and electromagnetic field generated by the inductive coils 817 and RF power supply 818. The processing volume 826 is fluidly coupled to one or more dedicated vacuum pumps, through a vacuum outlet 820, which maintain the processing volume 826 at sub-atmospheric conditions and evacuate processing, and/or other gases, therefrom. A substrate support assembly 836, disposed in the processing volume 826, is disposed on a support shaft 838 sealingly extending through the chamber base 824.

The substrate 803 is loaded into, and removed from, the processing volume 826 through an opening (not shown) in one of the one or more sidewalls 822, which is sealed with a door or a valve (not shown) during plasma processing of the substrate 803. Herein, the substrate 803 is transferred to and from a receiving surface of an ESC substrate support 805 using a lift pin system (not shown).

The substrate support assembly 836 includes a support base 807 and the ESC substrate support 805 that is thermally coupled to, and disposed on, the support base 807. Typically, the support base 807 is used to regulate the temperature of the ESC substrate support 805, and the substrate 803 disposed on the ESC substrate support 805, during substrate processing. In some embodiments, the support base 807 includes one or more cooling channels (not shown) disposed therein that are fluidly coupled to, and in fluid communication with, a coolant source (not shown), such as a refrigerant source or water source having relatively high electrical resistance. In some embodiments, the ESC substrate support 805 includes a heater (not shown), such as a resistive heating element embedded in the dielectric material thereof. Herein, the support base 807 is formed of a corrosion resistant thermally conductive material, such as a corrosion resistant metal, for example aluminum, aluminum alloy, or stainless steel and is coupled to the substrate support with an adhesive or by mechanical means. Typically, the ESC substrate support 805 is formed of a dielectric material, such as a bulk sintered ceramic material, such as a corrosion resistant metal oxide or metal nitride material, for example aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the ESC substrate support 805 further includes a biasing electrode 804 embedded in the dielectric material thereof. In one configuration, the biasing electrode 804 is a chucking pole used to secure (chuck) the substrate 803 to a supporting surface of the ESC substrate support 805 and to bias the substrate 803 with respect to the processing plasma 801 using a pulsed-voltage biasing scheme described herein. Typically, the biasing electrode 804 is formed of one or more electrically conductive parts, such as one or more metal meshes, foils, plates, or combinations thereof. Herein, the biasing electrode 804 is electrically coupled to a HVM 816, which provides a chucking voltage thereto, such as static DC voltage between about −5000 V and about 5000 V, using an electrical conductor, such as the coaxial transmission line 806, e.g., a coaxial cable.

The support base 807 is electrically isolated from the chamber base 824 by an insulator plate 811, and a ground plate 812 is interposed between the insulator plate 811 and the chamber base 824. In some embodiments, the processing chamber 800 further includes a quartz pipe 810, or collar, circumscribing the substrate support assembly 836 to prevent corrosion of the ESC substrate support 805 and, or, the support base 807 from contact with corrosive processing gases or plasma, cleaning gases or plasma, or byproducts thereof. Typically, the quartz pipe 810, the insulator plate 811, and the ground plate are circumscribed by a liner 808. Herein, a plasma screen 809 approximately coplanar with the substrate receiving surface of the ESC substrate support 805 prevents plasma from forming in a volume between the liner 808 and the one or more sidewalls 822.

The biasing electrode 804 is spaced apart from the substrate receiving surface of the ESC substrate support 805, and thus from the substrate 803, by a layer of dielectric material of the ESC substrate support 805. In this configuration, a parallel plate like structure is formed by the biasing electrode 804 and the layer of the dielectric material which can have an effective capacitance of between about 5 nF and about 50 nF. Typically, the layer of dielectric material has a thickness between about 0.1 mm and about 1 mm, such as between about 0.1 mm and about 0.5 mm, for example about 0.3 mm. Herein, the biasing electrode 804 is electrically coupled to the PVWG 150 using the external conductor, such as the transmission line 806, which is disposed within the transmission line 131. The PVWG 150 and the components thereof are described in detail earlier in the text of this disclosure. In some embodiments, the dielectric material and layer thickness can be selected so that the capacitance $C_e$ of the layer of dielectric material is between about 5 nF and about 50 nF, such as between about 7 and about 10 nF, for example.

Generally, a low neutral fill pressure in the processing volume 826 of the processing chamber 800 results in poor thermal conduction between surfaces disposed therein, such as between the dielectric material of the ESC substrate support 805 and the substrate 803 disposed on the substrate receiving surface thereof, which reduces the ESC substrate support's 805 effectiveness in heating or cooling the substrate 803. Therefore, in some processes, a thermally conductive inert heat transfer gas, typically helium, is introduced into a volume (not shown) disposed between a non-device side surface of the substrate 803 and the substrate receiving surface of the ESC substrate support 805 to improve the heat transfer therebetween. The heat transfer gas, provided by a heat transfer gas source (not shown), flows to the backside volume through a gas communication path (not shown) disposed through the support base 807 and further disposed through the ESC substrate support 805.

The processing chamber 800 further includes a processing chamber controller 126. The processing chamber controller 126 herein includes a central processing unit (CPU) 833, a memory 834, and support circuits 835. The processing chamber controller 126 is used to control the process sequence used to process the substrate 803 including the substrate biasing methods described herein. The CPU 833 is a general purpose computer processor configured for use in an industrial setting for controlling processing chamber and sub-processors related thereto. The memory 834 described herein may include random access memory, read only memory, floppy or hard disk drive, or other suitable forms of digital storage, local or remote. The support circuits 835 are conventionally coupled to the CPU 833 and comprise cache, clock circuits, input/output subsystems, power supplies, and the like, and combinations thereof. Software instructions (program) and data can be coded and stored within the memory 834 for instructing a processor within the CPU 833. A software program (or computer instructions) readable by CPU 833 in the processing chamber controller 126 determines which tasks are performable by the components in the processing chamber 800. Preferably, the program, which is readable by CPU 833 in the processing chamber controller 126, includes code, which when executed by the processor (CPU 833), perform tasks relating to the monitoring and execution of the electrode biasing scheme described herein. The program will include instructions that are used to control the various hardware and electrical components within the processing chamber 800 to perform the various process tasks and various process sequences used to implement the electrode biasing scheme described herein.

The PVWG 150 establishes a pulsed voltage waveform on a load (e.g., the complex load 130), which is formed by use of the biasing electrode 804. The PVWG 150 includes a nanosecond pulse generator 814 and a current-return output stage 815, which are schematically illustrated in FIGS. 8A and 8B. The nanosecond pulse generator 814 maintains a predetermined, substantially constant positive voltage across its output (i.e. to ground) during regularly recurring time intervals of a predetermined length, by repeatedly closing and opening its internal switch at a predetermined rate. FIG. 8A shows a simplified, functionally equivalent schematic representation of the nanosecond pulse generator 814. In FIG. 8A, the nanosecond pulse generator 814 is reduced to a minimal combination of the components that are important for understanding of its role in establishing a desired pulsed voltage waveform at the biasing electrode 804. These components generally include an internal voltage source, a high repetition rate switch, and a flyback diode, among others. It needs to be understood that an actual nanosecond pulse generator may include any number of internal components and may be based on a more complex electrical circuit than that of FIG. 8A. In turn, a schematic diagram of FIG. 8A provides only a functionally equivalent representation of the components of the nanosecond pulse generator 814 and its electrical circuitry, in as much as is required to explain the fundamental principle of its operation, its interaction with the plasma in the processing volume, and its role in establishing a pulsed voltage waveform (such as the input pulsed voltage waveform 140) at the biasing electrode 804. As can be inferred from a schematic diagram shown in FIG. 8A, when the switch $S_1$ moves from the open (Off) to the closed (On) position, it connects the output of the nanosecond pulse generator to its internal voltage source that produces a substantially constant output voltage. In one or more embodiments, the purpose of a flyback diode, which can also be substituted by a different snubber circuit, is to suppress, or "snub", a possible voltage spike caused by opening of the switch $S_1$, which is followed by a rapid release of the magnetic energy accumulated in the inductive elements. These inductive elements comprise: (A) an external electrical conductor, such as the transmission line 806 with the combined inductance $L_{transm}$, and (B) components of the PVWG 150, including an internal electrical conductor connecting the nanosecond pulse generator 814 and the current-return output stage 815, with the combined inductance $L_{internal}$. The nanosecond pulse generator 814 may be primarily used as a charge injector (current source), and not as a constant voltage source; therefore it is not necessary to impose stringent requirements on the stability of the output voltage, in that it can vary in time even when the switch remains in the closed (On) position. Further, in some configurations, the nanosecond pulse generator 814 is fundamentally a sourcing, but not a sinking supply, in that it only passes a current in one direction (e.g., the output can charge, but not discharge a capacitor). Additionally, when the switch remains in the open (Off) position, the voltage $V_O$, across the output of the nanosecond pulse generator is not controlled by the internal voltage source and is instead determined by the interaction of its internal components with other circuit elements.

The current-return output stage 815 has one end 815B connected to ground, and another end 815A connected through the internal electrical conductor to the positive output of the nanosecond pulse generator and simultaneously to the external electrical conductor that is coupled to one side of the generator coupling assembly 133 (FIG. 1B). The current-return output stage 815 can be comprised of the following elements: a resistor, a resistor and an inductor connected in series, a switch, or a more complex combination of electrical elements, including parallel capacitors, which permits a positive current flow towards the ground.

Transmission line 131 electrically connects the output of the PVWG 150 to the chucking pole (e.g., biasing electrode 804). The output of the PVWG 150 is the end 815A, where the output of the nanosecond pulse generator 814 is connected through the internal electrical conductor to the current-return output stage 815. The electrical conductor of the transmission line 131, which is connected to the biasing electrode side of the generator coupling assembly 133 and to the biasing electrode 804, may include: (a) a coaxial transmission line 806, which may include a flexible coaxial cable with the inductance $L_{flex}$ in series with a rigid coaxial transmission line with the inductance $L_{rigid}$, (b) an insulated high-voltage corona-resistant hookup wire, (c) a bare wire, (d) a metal rod, (e) an electrical connector, or (f) any combination of electrical elements in (a)-(e). Note that the internal electrical conductor may comprise the same basic elements as the external electrical conductor.

The biasing electrode 804 is usually a metal plate embedded into the electrostatic chuck and separated from the plasma by a thin layer of dielectric material. The chucking pole can be the biasing electrode 804 embedded within the electrostatic chuck portion (i.e., ESC substrate support 805). The external conductor, such as the transmission line 806, and the biasing electrode 804 have some combined stray capacitance to ground, $C_s$.

FIG. 8B depicts a functionally equivalent, simplified electrical circuit 840 of the pulsed voltage biasing scheme proposed herein, including the plasma in the process volume. These circuits are used to model the main aspects of the interaction of the pulsed voltage waveform generator (e.g., PVWG 150) with the processing chamber 800; explain the basic principle of operation and the role of the pulsed voltage waveform generator in establishing of the pulsed voltage waveform at a biasing electrode (e.g., biasing electrode 804); describe the accompanying physical phenomena taking place during different phases of the pulsed voltage waveform; and generally explain the basic principle of operation of a pulsed voltage biasing scheme. For clarity purposes, the following definitions are used throughout this disclosure: (1) unless a reference is specified, all potentials are referenced to ground; (2) the voltage at any physical point (like a substrate or a biasing electrode) is likewise defined as the potential of this point with respect to ground (zero potential point); (3) the cathode sheath is implied to be an electron-repelling, ion-accelerating sheath that corresponds to a negative substrate potential with respect to plasma; (4) the sheath voltage (also referred to sometimes as "sheath voltage drop"), $V_{sh}$, is defined as the absolute value of the potential difference between the plasma and the adjacent surface (e.g. of the substrate or the chamber wall); and (5) the substrate potential is the potential at the substrate surface facing the plasma.

Firstly, the dielectric layer in the electrostatic chuck, and the processed substrate (e.g., a 0.3 to 0.8 mm thick doped-silicon slab with the capacitance of >10 nF) placed on its surface separate the chucking pole (e.g., biasing electrode 804) from the plasma and are represented in the circuits in FIG. 8B by a single chuck capacitor 843 (which in reality is two capacitors connected in series) with a capacitance $C_e$ (~7-10 nF, for example). In other words, the substrate (typically made out of a thin layer of a semiconductor and/or dielectric material) may be considered to be electrically a part of the ESC dielectric layer and whenever reference to the chuck capacitance $C_e$ (i.e., item 843) is made, it is implied that $C_e$ is the combined series capacitance of the ESC (i.e., $C_{ESC}$ (~dielectric layer capacitance)) and the substrate (i.e., $C_w$). Since the substrate capacitance $C_w$ is typically very large (>10 nF), or substrate may be conductive (infinite capacitance), the series capacitance is determined primarily by the actual $C_{ESC}$.

Secondly, the biasing electrode 804, the PVWG 150, and the external electrical conductor (e.g., transmission line 131) connecting biasing electrode 804 with the PVWG 150 have: (A) some combined stray capacitance to ground, which is represented by a single stray capacitor 842 with the capacitance $C_s$ (~500 pF, for example); as well as (B) some inductance, which is represented by inductors $L_{internal}$ for the internal electrical conductor and other components of the PVWG 150, and inductances $L_{interconnect}$ and $L_{external}$ (i.e., items 845A and 845B) for the external electrical conductor, such as the transmission line 806. The current-return output stage 815 is represented in the circuit 840 by resistor $R_{ros}$ (~150 Ohm, for example) and inductor $L_{ROS}$, which can also optionally include a switch $S_2$.

As shown in FIG. 8B, the PVWG 150 may also include a bypass resistor $R_{bypass}$ and a current sensing circuit 821 that are connected in parallel with the current-return output stage 815. The current sensing circuit 821 includes the current sense resistor $R_{sense}$ (i.e., item 139) and a switch $S_3$ that can be used to sense the current flowing through the current-return output stage 815 during one or more phases of a pulse.

Thirdly, a standard electrical plasma model that represents the entire plasma in the process volume as three series elements may be utilized. For example, an electron-repelling cathode sheath 844 (which we sometimes also refer to as the "plasma sheath" or just the "sheath") adjacent to the substrate. The cathode sheath is represented in FIG. 8B by a conventional three-part circuit element comprising: (a) the diode $D_{SH}$, which when open represents the sheath collapse, (b) the current source $I_i$ (e.g., ~0.5-5 A), representing the ion current flowing to the substrate in the presence of the sheath, and (c) the capacitor $C_{SH}$ (~100-300 pF, for example, for high aspect ratio applications), which represents the sheath for the main portion of the biasing cycle (~90%), i.e., ion current phase (e.g., phase after the short pulse is delivered), during which the ion acceleration and the etching occur.

A bulk plasma 846 is represented in FIG. 8B by a single resistor of ~5-10 Ohms. An electron-repelling wall sheath forming at the chamber wall is represented in FIG. 8B by a 3-part circuit element comprising: (a) the diode $D_w$, (b) the current source $I_{iw}$ (e.g., ~5-10 A) representing the ion current to the wall, and (c) the capacitor $C_w$ (e.g., ~5-10 nF), which represents the wall sheath primarily during the ESC recharging phase, when there is no electron-repelling cathode sheath and the wall sheath capacitor is being charged by the large current pushed through the ESC by the nanosecond pulse generator. Because the cathode sheath is much thicker than the wall sheath (due to a high voltage), and the total wall area is much larger than the substrate area, it is assumed that $C_w \gg C_{SH}$. The interior surface of the grounded metal walls is considered be coated with a thin layer of a dielectric material, represented in FIG. 8B by a large capacitor $C_{coat}$ (e.g., ~300-1000 nF).

In some embodiments, as shown in FIGS. 8A and 8B, the system includes a high-voltage module (HVM) 816 used for chucking, such as "electrically clamping", the substrate to the substrate receiving surface of the ESC substrate support, as shown in FIG. 8A. Chucking the substrate allows filling a gap between the substrate receiving surface and the non-device side surface of the substrate with helium gas (He), which is done in order to provide good thermal contact between the two and allow substrate temperature control by regulating the temperature of the ESC substrate support. Combining a DC chucking voltage produced by the HVM with the pulsed voltage produced by the PVWG 150 at a biasing electrode 804 will result in an additional voltage offset of the pulsed voltage waveform equal to the DC chucking voltage. The effect of the HVM 816 on the operation of the PVWG 150 can be made negligible by selecting appropriately large blocking capacitor $C_{hvm}$ and $R_{hvm2}$. The resistance $R_{hvm2}$ schematically illustrates a resistor positioned within the components connecting the HVM 816 to a point within the transmission line 131. The main function of the blocking capacitor $C_{hvm}$ of in the simplified electrical circuit 840 is to protect the PVWG 150 from the HVM DC voltage produced by the DC power supply $V_{hvm}$, which thus drops across $C_{hvm}$ and does not perturb the PVWG 150 output. The value of $C_{hvm}$ is selected such that while blocking only the HVM DC voltage, it does not present any load to the pulsed bias generator's high-frequency output voltage. By selecting a sufficiently large $C_{hvm}$ (e.g., 40-80 nF) the $C_{hvm}$ is nearly transparent for a 400 kHz signal, for example, in that it is much bigger than any other relevant capacitance in the system and the voltage drop across this element is very small compared to that across other relevant capacitors, such as chuck capacitance $C_e$, and sheath capacitance $C_{SH}$. In turn, the purpose of the blocking resistor $R_{hvm2}$ is to block the high-frequency pulsed bias generator's voltage and minimize the current it induces in the HVM DC voltage supply. This blocking resistor $R_{hvm2}$ needs to be large enough to efficiently minimize the current through it. For example, an $R_{hvm2} > 1$ MOhm is typically large enough to make the 400 kHz current from the pulsed bias generator into the HVM negligible. The resultant average induced current of the order of 0.5-1 mA is indeed much smaller than a typical limitation for HVM power supplies, which is about 5 mA DC current. The $C_{hvm1}$ and $R_{hvm1}$, and also the $R_{hvm2}$, together form a current suppressing/filtering circuit for the pulsed voltage, so that pulsed voltage does not induce current through the HVM 816.

In some embodiments, the feedback loop 100 is coupled to one or more points within the PVWG 150 or along the electrical conductor disposed between the PVWG 150 and the blocking capacitor $C_{hvm}$, which is disposed within the generator coupling assembly 133. For example, one or more input channels 110 of the feedback loop 100 is coupled via connection to one or more points along the electrical conductor disposed between the PVWG 150 and the blocking capacitor $C_{hvm}$. Further, in some embodiments, one or more of the input channels 110 are electrically coupled via connection to one or more points along the electrical conductor disposed between the blocking capacitor $C_{hvm}$ and the biasing electrode 804 in the processing chamber 800. For example, one or more input channels 110 are electrically coupled to one or more points along the electrical conductor disposed between the blocking capacitor $C_{hvm}$ and the biasing electrode 804 in the processing chamber 800. Alternatively, in other embodiments, one or more of the input channels 110 are coupled to one or more points along the electrical conductor disposed on both sides of blocking capacitor $C_{hvm}$. For example, a first one or more input channels 110 are electrically coupled to a point along the electrical conductor disposed between the PVWG 150 and the blocking capacitor $C_{hvm}$ and a second one or input channel 110 are coupled to a point along the electrical conductor disposed between blocking capacitor $C_{hvm}$ and the biasing electrode 804 in the processing chamber 800.

Pulse Waveform Examples

Figure 9A:
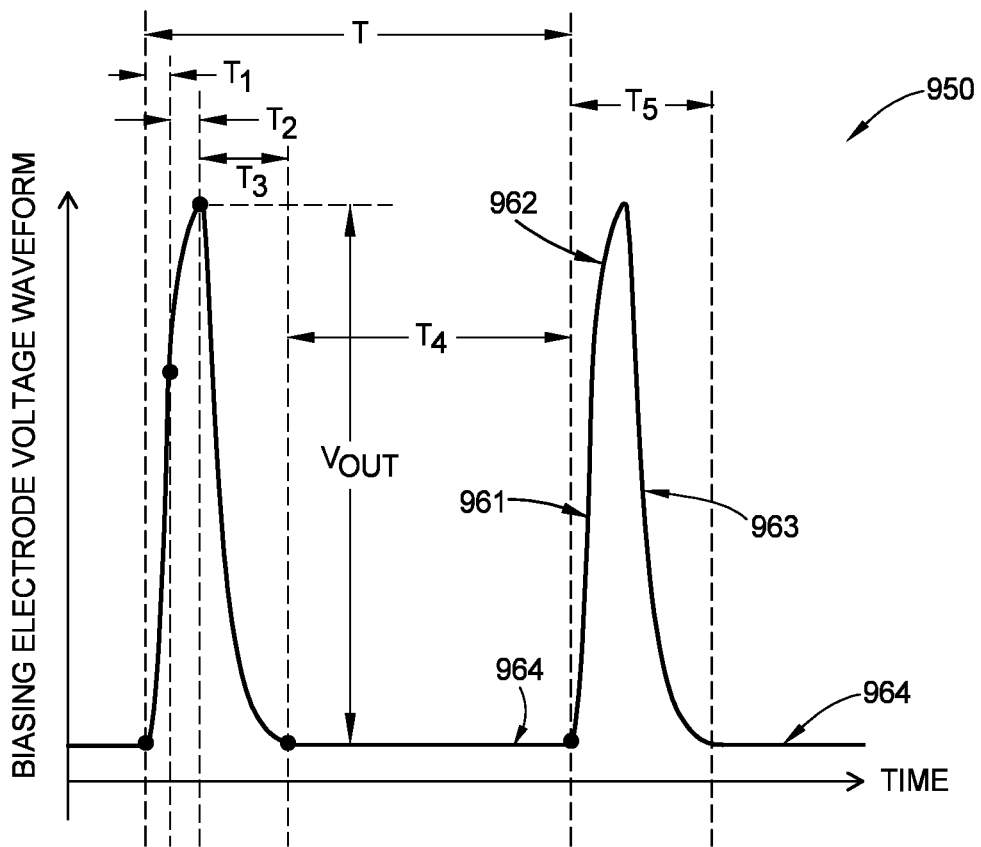
FIG. 9A illustrates an example of a pulsed voltage waveform established at the biasing electrode, according to one embodiment.
Figure 9B:
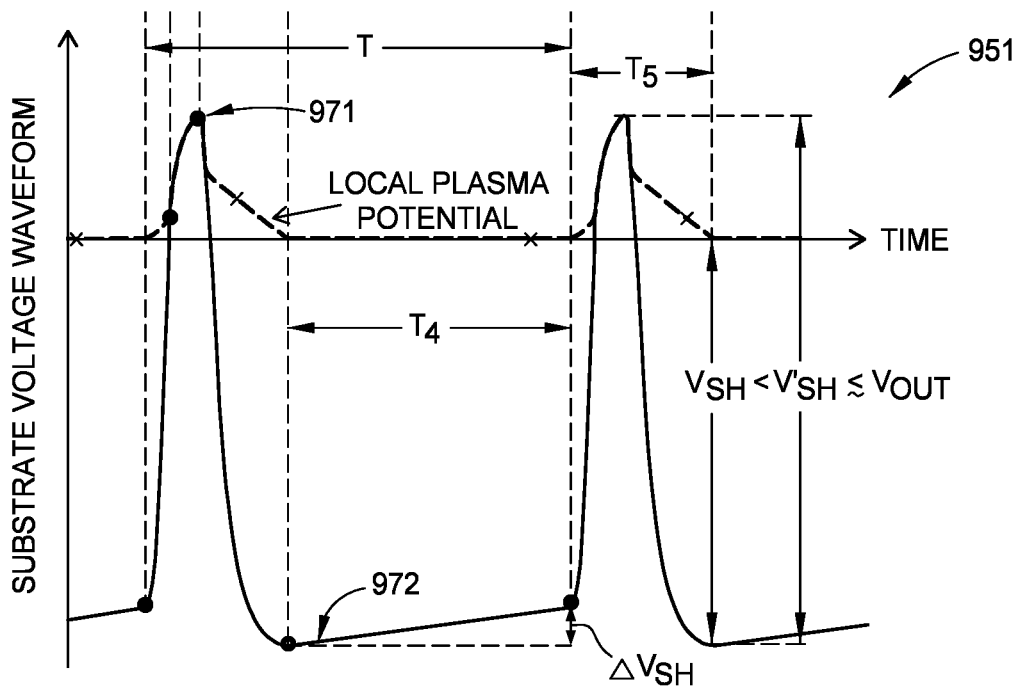
FIG. 9B illustrates an example of a pulsed voltage waveform established at a substrate, according to one embodiment.

FIG. 9A illustrates an example of a pulsed voltage waveform 950 that is established at the biasing electrode 804. The pulsed voltage waveform 950 shown in FIG. 9A results in the substrate voltage waveform 951 shown in FIG. 9B, and thus can enable keeping the sheath voltage nearly constant for about 90% of the substrate processing time during a plasma process. The pulsed voltage waveforms 950 and 951 pictured in FIGS. 9A and 9B, are generally based on a waveform that could be generated from the simplified electrical circuit 840 illustrated in FIG. 8B. The waveforms illustrated in FIGS. 9A-9B are only intended to show a simplified schematic representations of a pulsed voltage waveform that can be used with one of the methods described herein, which can be used during plasma processing of a substrate. The actual waveforms generated by the PVWG 150 can be significantly more complex and contain a number of fine-scale features (e.g., high-frequency oscillations caused by the presence of inductive elements) that are not shown in FIGS. 9A-9B. However, examples of some types of fine scale features can be seen in FIGS. 6A-6B and 7A-7B. However, these fine-scale features are not essential for understanding of the underlying physical phenomena determining the general shape of the actual pulsed voltage waveform produced by the pulsed voltage biasing scheme and control methods proposed herein.

In FIG. 9A, the pulsed voltage waveform 950 comprises a periodic series of short positive pulses repeating with a period T (e.g., 2.5 microseconds), on top of a voltage offset. A waveform within each period (repetition cycle) includes the following:

(1) A positive voltage jump to charge the system's stray capacitor and collapse the cathode sheath, i.e., the sheath collapse phase 961, during which the sheath capacitor $C_{sh}$ is discharged and the substrate potential is brought to the level of the local plasma potential (as illustrated in FIG. 9B). The sheath collapse phase 961 enables rapid recharging of the chuck capacitor $C_e$ by electrons provided from the plasma during the ESC recharging phase 962. The switch S1 (see FIG. 8B) closes and remains in the closed (On) position for the duration of the phase 961, allowing the nanosecond pulse generator, such as PVWG 150, to maintain a substantially constant positive voltage across its output and supply a current to the system. The duration T1 of the phase 961 is much shorter than the duration T4 of the ion current phase 964 (described below) or than the overall period T, and is typically of the order of several tens of nanoseconds (e.g., 20-50 ns). This is because the plasma current during the phase 961 is carried by electrons—namely, the electron cloud is moving towards the substrate and gradually sweeps over the ion space charge, thus eliminating the sheath voltage drop—and the electron velocity is much greater than the ion velocity, due to a very large mass ratio between the two species.

(2) Recharging of the chuck capacitor $C_e$, during the ESC recharging phase 962, by rapidly injecting a charge of equal value and opposite polarity to the total charge accumulated on the substrate surface during the ion current phase 964 (described below). As during the phase 961, the PVWG 150 maintains a substantially constant positive voltage across its output (switch S1 remains in the "On" position). Similarly to the phase 961, the duration T2 of the phase 962 is much shorter than the duration T4 of the ion current phase 964 (described below) or than the overall period T, and is typically of the order of several tens of nanoseconds (e.g., 30-80 ns). This is because the plasma current during the phase 962 is also carried by electrons—namely, in the absence of the cathode sheath, the electrons reach the substrate and build up the surface charge, thus charging the capacitor $C_e$.

(3) A negative voltage jump ($V_{OUT}$) to discharge the processing chamber's stray capacitor, re-form the sheath and set the value of the sheath voltage ($V_{SH}$) during the sheath formation phase 963. The switch S1 in FIG. 8B opens at the beginning of the sheath formation phase 963 and the inductive elements rapidly (within about 10 nanoseconds, for example) release their stored magnetic energy into the chuck capacitor, $C_e$, and the stray capacitor $C_s$. Inductive elements may include the internal components of the PVWG 150 (e.g. the internal conductor) represented by the inductance $L_{internal}$, and the external conductor (e.g. the transmission line 806) represented by the inductances $L_{interconnect}$ and $L_{external}$ in circuit 840. During the magnetic energy release, the corresponding current flows through the flyback diode or a different snubber circuit with a similar function of suppressing (or "snubbing") the possible voltage spikes. We note here, that without the flyback diode (or a different component with a similar function of "snubbing" the possible voltage spikes), the magnetic energy would need to be released through the resistive current-return output stage, resulting in an impractically large negative voltage across R1 (e.g., −20 kV, which is potentially damaging to the internal components of the pulsed bias generator 240) for several nanoseconds, instead of collapsing to near-zero values. After the magnetic energy is released and the current through inductances $L_{interconnect}$ and $L_{external}$ drops to zero (as well as through $L_{internal}$), it reverses the direction and flows from the plasma and the stray capacitor to ground through the current-return output stage (the flyback diode, being reverse-biased, blocks the current flow through itself), thus discharging the stray capacitor, $C_s$, and charging the sheath capacitor, $C_{sh}$, (i.e., re-forming the sheath). The beginning of sheath formation (charging of $C_{sh}$) can be clearly identified in FIG. 9B as the point, at which the substrate potential starts decreasing below the local plasma potential. Similarly to the phase 961, the duration T3 of the phase 963 is much shorter than the duration T4 of the ion current phase 964 (described below) or than the overall period T, and is typically of the order of 100-300 ns. This is because the plasma current during the phase 963 is likewise carried by electrons—namely, the electron cloud is moving away from the substrate and gradually exposes the ion space charge, thus forming the sheath and producing the sheath voltage drop. We note that (1) T3 is determined primarily by the stray capacitance, as well as the values of the elements (e.g. resistor) comprising the current-return output stage; and (2) the negative voltage jump, $V_{OUT}$, and established sheath voltage, $V_{SH}$, are determined by $V_m$ (magnitude of the nanosecond pulse generator output voltage during phases 961-962), and the total pulse width, $T_{tot}=T_{rise}+T_p=T_1+T_2$.

(4) A long (about 85-90% of the cycle duration T) ion current phase 964 with the duration T4, during which the PVWG 150 likewise does not maintain a positive voltage across its output (switch S1 remains in the Off position) and the ion current flows from plasma to ground through the current-return output stage. The ion current causes accumulation of the positive charge on the substrate surface and gradually discharges the sheath and chuck capacitors, slowly decreasing the sheath voltage drop and bringing the substrate potential closer to zero. This results in the voltage droop $\Delta V_{SH}$ in the substrate voltage waveform 951 shown in FIG. 9B. The generated sheath voltage droop is why the pulsed voltage waveform 950 needs to move to the next cycle described in (1)-(3) above, during which the PVWG 150 removes the charge accumulated during the ion current phase (or restores the initial ESC charge) and reestablishes the desired sheath voltage $V_{SH}$. Note that the surface charge and sheath voltage droop accumulate whenever there is an electron-repelling cathode sheath and the unbalanced net current (equal to the ion current) from the bulk plasma. This is because the ion current from the bulk plasma is not balanced by the electron current from the bulk plasma, due to the sheath electric field repelling the electrons away from the substrate. Thus, the surface charge accumulation and voltage droop generation also take place during the sheath formation phase 963, during which there is a non-zero sheath voltage drop present right from the beginning.

Figure 9C:
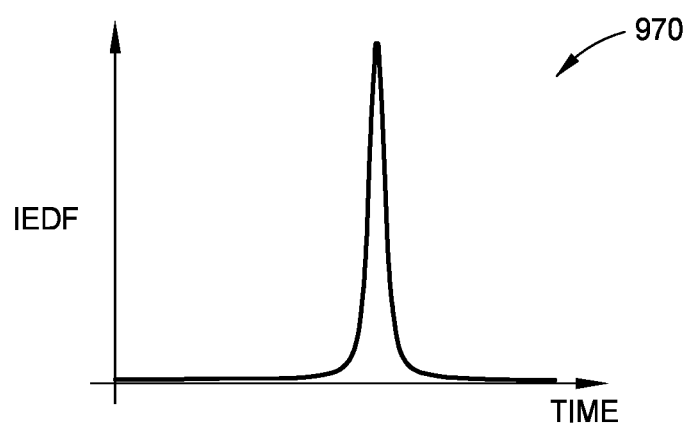
FIG. 9C illustrates an example of a single-peak IEDF, according to one embodiment.

As can be seen from the (1)-(4) above, the combined duration of the "electron current" phases 961-963 constituting a single voltage pulse of the pulsed voltage waveform (such as the pulsed voltage waveform 950) is about 200-400 ns, which corresponds to the relatively short duty cycle of about 10-15%. The short duty cycle characteristic of the pulsed voltage waveform 950 is a consequence of a large ion-to-electron mass ratio that is typical for all plasmas. Thus, in the pulsed voltage biasing scheme as discussed herein, the PVWG 150 actively interacts with the plasma only during a short portion of each cycle, allowing the cathode sheath to evolve naturally for the rest of the time. By effectively using the fundamental plasma properties, this biasing scheme enables maintaining a nearly constant sheath voltage for up to ~90% of the processing time, which results in a single peak IEDF (such as IEDF 970 in FIG. 9C). Conversely, in a conventional biasing scheme, an applied RF voltage modulates the cathode sheath throughout the entire RF period, thus unduly varying the sheath voltage drop all of the time and resulting in a dual-peak IEDF.

The pulsed voltage biasing scheme discussed herein enables maintaining a particular substrate voltage waveform, such as the substrate voltage waveform 951 shown in FIG. 9B, which can be described as a periodic series of short positive pulses 971 on top of the negative voltage offset 972. During each pulse (having a total duration of T5=T1+T2+T3), the substrate potential reaches the local plasma potential and the sheath briefly collapses. However, for about 90% of each cycle (having a cycle duration T), the sheath voltage drop remains nearly constant and approximately equal to the absolute value of the most negative substrate potential, $V_{SH}$ (FIG. 9B), which thus determines the mean ion energy at the substrate surface. During the sheath collapse phase 961 of the biasing cycle, the current from the nanosecond pulse generator (e.g., 814) splits between the processing plasma and the stray capacitor $C_s$, connected in parallel, approximately according to the ratio $C_{SH}/C_s$ and is not very significant. Because of that and because $C_w$ is generally very large, the voltage drop accumulating across the wall sheath during phase 961 is relatively small. As a result, the near-wall plasma potential, VW, which is equal to the sum of the wall sheath voltage drop and the expectedly small voltage drop across the wall dielectric coating, remains close to zero. Hence, the local (near-substrate) plasma potential, $V_{pl}$, which is equal to the sum of the near-wall plasma potential and the voltage drop across the bulk plasma, is determined primarily by the latter, and it increases slightly above zero. In turn, during the ESC recharging phase 962 there is no electron-repelling cathode sheath and the wall sheath capacitor is being charged to a substantial voltage (e.g. several hundred volts) by the large current pushed through the ESC by the PVWG 150. Due to the increase of the near-wall plasma potential, as well as the presence of a comparably large voltage drop across the bulk plasma (caused by the same large current), the local (near-substrate) plasma potential, $V_{pl}$, as well as the substrate potential Vsub, experience a substantial increase of up to about ⅓ of the established sheath voltage $V_{SH}$. Finally, during the sheath formation phase 963, the current through the processing plasma is again (as in phase 961) determined by the ratio $C_{SH}/C_s$ and is relatively small (also quickly decaying), as well as the resultant voltage drop across the bulk plasma. Therefore, the local (near-substrate) plasma potential remains approximately equal to the near-wall plasma potential, and they both relax to near-zero values closer to the end of the phase 963, as the wall sheath gets discharged primarily by the ion current to the chamber walls. As a result of the local plasma potential perturbation during phases 961-963, the established sheath voltage $V_{SH}$, constitutes only ~75% of the overall negative jump in the substrate voltage waveform 951 at the end of the phase 963. The negative jump $V'_{SH}$ defines the maximum sheath voltage for given $V_m$ and $T_{tot}$ (attainable only with near-infinite $C_w$ and near-zero $R_{pl}$), and it is close to the negative jump in the pulsed voltage waveform 950, or $V'_{SH} \sim V_{OUT}$. The latter is because during the phase 963, the chuck capacitor transfers only a small portion ($\propto C_{SH}/C_e \ll 1$) of its initial charge to the sheath, thus maintaining a nearly constant potential difference between the electrode and the substrate. The relationship $V_{SH}/V_{OUT} \sim 0.75$-$0.8$ can be used in practice to estimate $V_{SH}$ from the measured $V_{OUT}$.

As is discussed herein and further below, in one or more of the embodiments of the disclosure provided herein, the feedback loop 100 and method(s) of using the same are provided to detect and adjust the output of the PVWG 150 to achieve pulsed voltage waveforms that have desirable waveform characteristics, such as the pulsed voltage waveform 950 and/or the substrate voltage waveform 951. In addition to the pulse waveform characteristic(s) discussed above that may detected and adjusted, other pulse waveform characteristic(s) may also be detected and adjusted, which, for example, may include the shape or slope of the pulse waveform during one or more of the pulse phases, the period of one or more of the phases (e.g., T1, T2, T3, T4, and T5), and other features of the pulse waveform.

Method Examples

Figure 10:
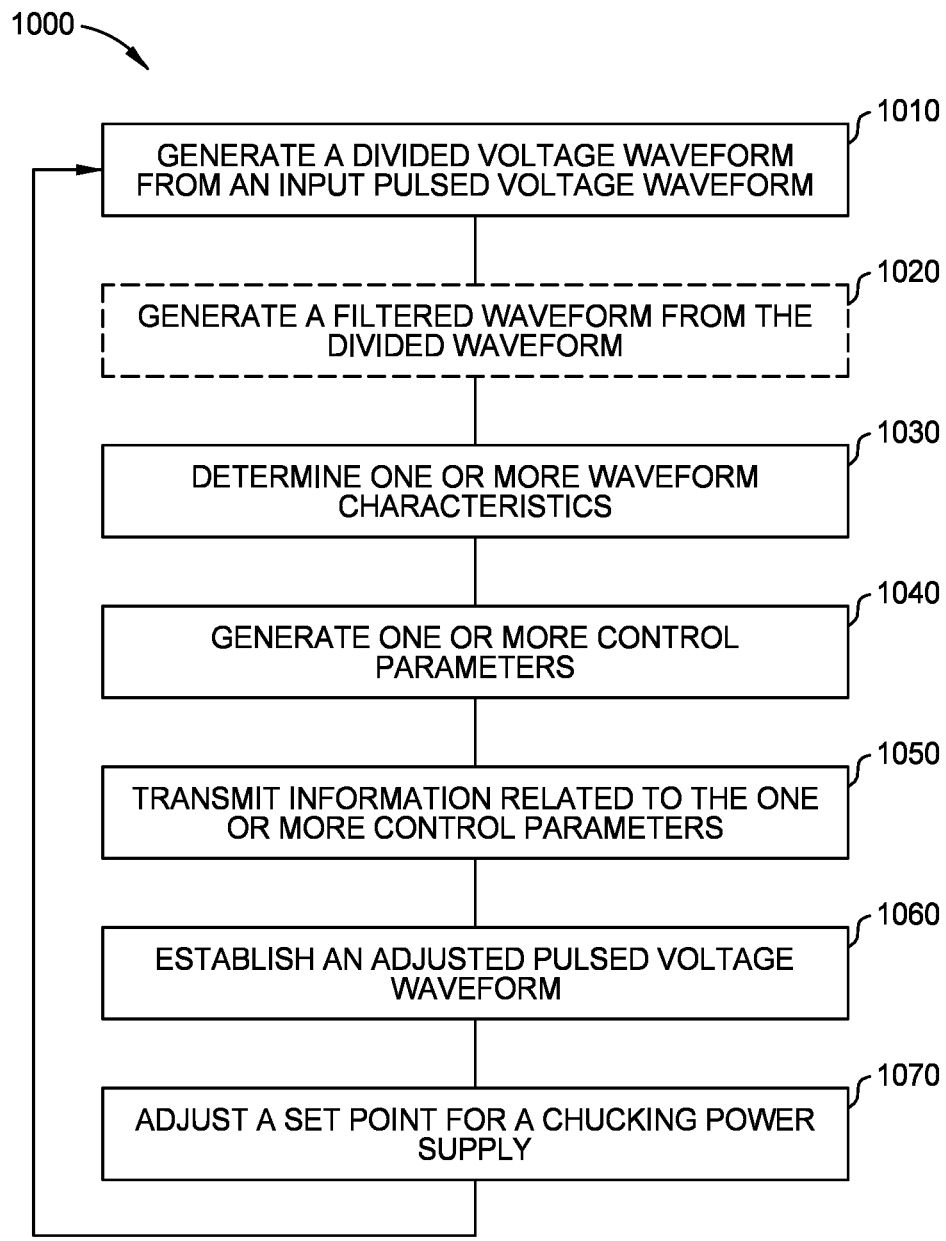
FIG. 10 is a flow diagram of a method of processing a substrate using a pulsed voltage biasing scheme described herein, according to one embodiment.

FIG. 10 is a flow chart of method 1000 for processing a pulsed voltage waveform, according to one or more embodiments. At operation 1010, an input pulsed voltage waveform 140 is processed by the components found in an input channel 110 to form an output waveform 144. In one configuration of an input channel 110, an input pulsed voltage waveform is divided using a first divider ratio to generate a first divided voltage waveform. For example, the input channel $110_1$ acquires an input pulsed voltage waveform $140_{1B}$, and the voltage divider 112 of the conditioning circuit $111_{1B}$ of the input channel $110_1$ receives the input pulsed voltage waveform and generates the first divided voltage waveform.

At operation 1020, the divided voltage waveform coming from the voltage divider 112 is low pass filtered to generate a filtered voltage waveform. In one example, the low pass filter 114 of the input channel $110_1$ receives the first divided voltage waveform from the voltage divider 112 and generates the filtered voltage waveform, which then forms the output waveform $144_{1B}$. The operation 1020 may be optional and may be omitted from the method 1000. Moreover, in some embodiments of method 1000, operation 1020 may be performed while operation 1010 is omitted.

After operations 1010 and/or 1020 have been performed, and the output waveform $144_{1B}$ has been generated by each input channels $110_1$, operation 1030 is then performed. At operation 1030, one or more waveform characteristics received from each input channel, such as input channel $110_1$, and processed by its respective acquisition channel 122 is determined by an algorithm running on the data acquisition controller 123. For example, the acquisition channel $122_1$ receives an output waveform from the input channel $110_1$ and algorithm determines one or more waveform characteristics from the output waveform $144_{1B}$.

In some embodiments, during operation 1030 the output waveform 144 from each of the input channels 110 is received by a driver (not shown) that is coupled to its respective acquisition channel 122. In one example, the output waveform $144_{1B}$ from the input channel $110_1$ is received by a driver of the acquisition channel $122_1$. The driver is used to convert the output waveform received from an input channel 110 into a differential signal. In this configuration, the differential signal is then received by an ADC (not shown) coupled to or within the acquisition channel 122. The ADC converts the differential signal from the analog domain to the digital domain and the output digital signal of the ADC is provided to a processor 121 coupled to the acquisition channel 122. The processor of the data acquisition controller 123 determines the one or more waveform characteristics of the output waveform by analyzing the output digital signal provided from the ADC. For example, the processor 121 analyzes an output digital signal to determine one or more of an amplitude, a pulse width, and a DC offset of a pulse within an output waveform 144 received from the input channel 110.

The operation 1030 may additionally include combining measurements received over a period of time from a corresponding input channel. For example, the data acquisition controller 123 may receive "Z" digitized waveforms from the acquisition channel $122_1$ over a first period, where Z is a whole number that is equal to two or more. The first period may correspond to "M" number of cycles of the input pulsed voltage waveform, where M is a whole number that is equal to one or more. The acquisition channel $122_1$ may combine the Z output waveforms. For example, the acquisition channel $122_1$ may average data corresponding to the Z output waveforms.

The operation 1030 may also additionally include the data acquisition controller 123 performing at least one of: 1) transmitting information related to the determined one or more waveform characteristics of a conditioned voltage waveform to a controller (e.g., controller of the feedback processor 125), and 2) transmitting information related to the second digitized voltage waveforms generated by the acquisition channels to a second controller (e.g., controllers 126, 127, 128 or 191).

At operation 1040, one or more control parameters are generated from the one or more waveform characteristics received from one or more input channels 110. For example, the data acquisition controller 123 transmits information corresponding to the one or more waveform characteristics to a feedback processor 125 and the feedback processor 125 generates the one or more control parameters from the one or more waveform characteristics. Referring back to the earlier input channel configuration example, in one example of operation 1040, the processor receives output waveforms from input channels $110_1$, $110_2$, and $110_3$, after the desired operations 1010-1030 have been performed, transmits information corresponding to the one or more waveform characteristics derived from the waveforms received and processed by the acquisition channels $122_1$, $122_2$, and $122_3$, respectively, to the feedback processor 125. The feedback processor 125 may then generate the one or more control parameters from the one or more received waveform characteristics. In one embodiment, the one or more control parameters may include an indication to adjust a DC charge voltage, adjust a pulse width, and adjust an amplitude of a pulse voltage waveform based on a comparison between the received waveform characteristics and target waveform characteristics stored in a memory of the feedback processor 125 or a memory coupled to the feedback processor 125. The stored target waveform characteristics may be waveform characteristics generated by the feedback loop 100 at a prior instant in time, an average of a series of waveform characteristics generated by the feedback loop 100 over a period of time, idealized waveform characteristics (e.g., model based waveform characteristics) that were generated and input into the memory by a user, or waveform characteristics generated by other desirable means.

Alternatively, or additionally, the data acquisition controller 123 may communicate information corresponding to the one or more waveform characteristics to a separate controller (e.g., controller 127, controller 128, controller 191 and/or the processing chamber controller 126) and the separate controller generates the one or more control parameters from the one or more waveform characteristics. Similarly, in one embodiment, the one or more control parameters generated by the controller may include, for example, an indication to adjust a pulse width, and adjust an amplitude of a pulse voltage waveform based on a comparison between the received waveform characteristics and target waveform characteristics stored in the memory of the controller. The stored target waveform characteristics may be waveform characteristics generated by the feedback loop 100 at a prior instant in time, an average of a series of waveform characteristics generated by the feedback loop 100 over a period of time, idealized waveform characteristics (e.g., model based waveform characteristics) that were generated and input into the memory by a user, or waveform characteristics generated by other desirable means.

At operation 1050, the feedback processor 125, or separate controller, transmits the information corresponding to the one or more control parameters to the PVWG 150. Further, in some embodiments, the data acquisition controller 123 may communicate information corresponding to the one or more waveform characteristics to the controller 128 and the controller 128 generates the one or more control parameters based on a comparison of the determined waveform characteristics and the information corresponding to the one or more target waveform characteristics. Therefore, in one embodiment, at operation 1050, the controller 128 transmits the information corresponding to the one or more control parameters to the PVWG 150, and/or another controller.

During operation 1060, an adjusted pulsed voltage waveform is delivered from the PVWG 150 based on the received one or more control parameters. For example, the PVWG 150 generates an adjusted pulsed voltage waveform that is provided to the biasing electrode 804.

At operation 1070, optionally, a plasma processing chamber process variable is separately or additionally adjusted, wherein the plasma processing chamber process variable may include a set point for a chucking power supply. For example, adjusting a set point for a chucking power supply (e.g., the HVM 816) may include increasing or decreasing the chucking voltage output by the chucking power supply. The adjustment of the set point for a chucking power supply will adjust the DC offset of subsequent pulsed voltage waveforms generated by the PVWG 150. The set point for the chucking power supply may be adjusted such that it is a DC voltage between about −5000 V and about 5000 V. In some embodiments, the method 1000 may omit operation 1060.

In some embodiments of method 1000, an adjusted pulsed voltage waveform is serially performed until a pulsed voltage waveform having desirable pulse waveform characteristics (e.g., target waveform characteristics) is achieved. In some embodiments, operations 1010-1050, or operation 1010-1060, are performed a plurality of times until the one or more target waveform characteristics of a pulsed voltage waveform within one waveform cycle are reached. For example, the controller 128, and/or the feedback processor 125 may change the one or more control parameters based on updated waveform characteristics determined by the data acquisition controller 123. The updated waveform characteristics are acquired by continuously processing the input pulsed voltage waveforms acquired by one or more of the input channels 110. In one example, the pulse width and/or amplitude may be increased until the pulse width and/or amplitude reach the corresponding target value that is stored in memory of the feedback processor or memory coupled to or within the data acquisition controller 123. Further, the adjusted pulsed voltage waveform can be continually adjusted, by changing one or more of the control parameters, until a maximum limit of a DC offset voltage is reached. For example, the one or more control parameters may be serially varied until the maximum DC offset voltage is reached.

In some embodiments, establishing the adjusted pulsed voltage waveform comprises changing the one or more of the control parameters until a maximum time limit for algorithm convergence is reached. For example, the feedback processor 125 monitors how long the PVWG 150 takes to generate an adjusted pulsed voltage waveform having one or more of the target waveform characteristics. When the PVWG 150 fails to generate an adjusted pulsed voltage waveform that is able to achieve a target pulsed waveform characteristic within a time limit, the feedback processor 125 may instruct the PVWG 150 to change another waveform characteristic. Additionally or alternatively, establishing the adjusted pulsed voltage waveform comprises changing one or more of the control parameters until a prior determined maximum limit of a pulse width of a pulsed voltage waveform is reached. Further, establishing the adjusted pulsed voltage waveform comprises changing one or more of the control parameters until a minimum limit of pulsed width of a pulsed voltage waveform is reached. The time limit and the maximum limit of a pulse width generally include prior determined values that are stored in memory (e.g., the memory 124, or 126A) and are retrieved by the processor (e.g., feedback processor 125 or the controller 128) for comparison the one or more pulsed voltage waveforms received by one or more of the input channels 110.

Figure 11:
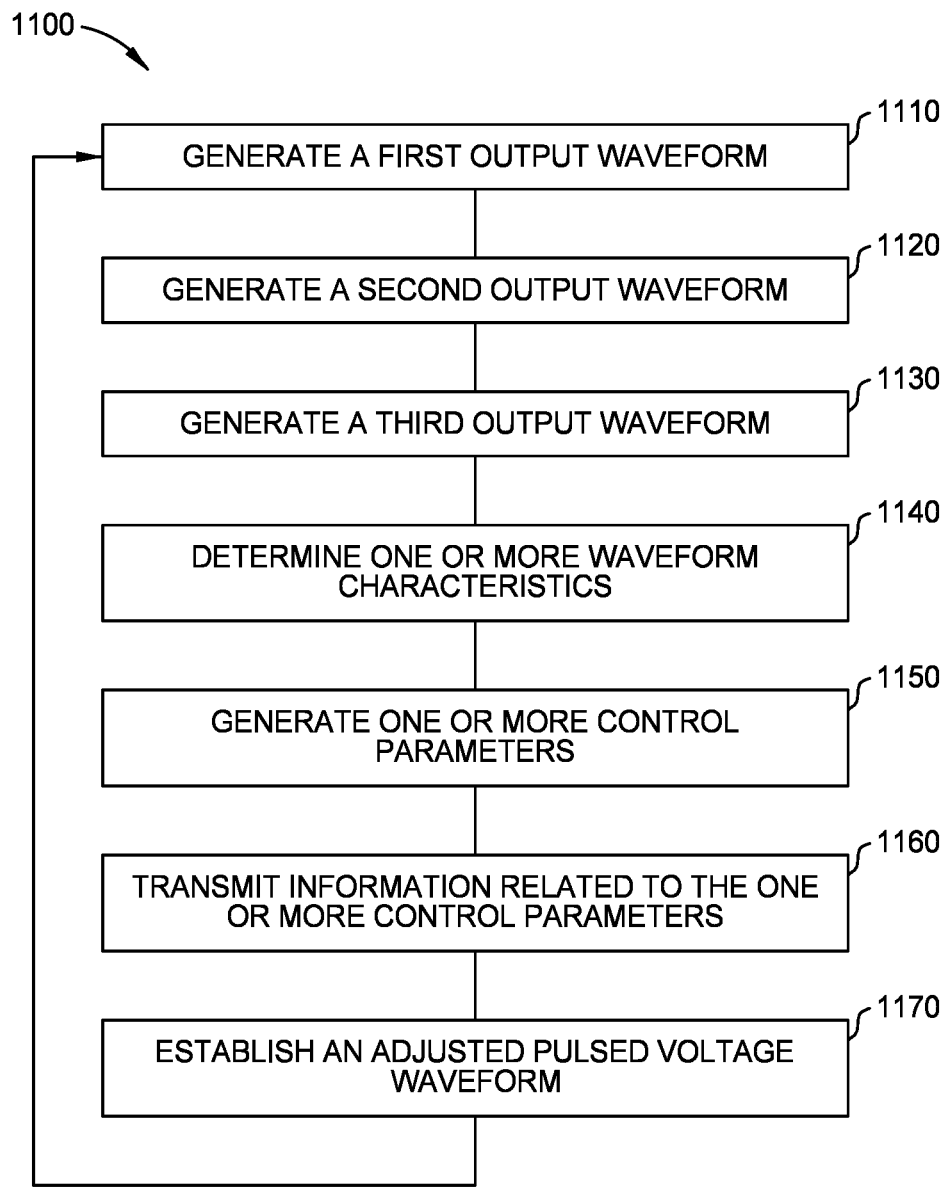
FIG. 11 is a flow diagram of a method of processing a substrate using a pulsed voltage biasing scheme described herein, according to one embodiment.

FIG. 11 is a flowchart illustrating a method 1100 for controlling a pulsed voltage waveform, according to one or more embodiments. At operation 1110, an output waveform 144 is generated by a first input channel 110. For example, the input channel $110_1$ acquires an input pulsed voltage waveform $140_{1B}$ and generates an output waveform $144_{1B}$ from the input pulsed voltage waveform $140_{1B}$. The input channel $110_1$ may include a voltage divider 112 and a low pass filter 114, and generating the first output waveform comprises generating a divided voltage waveform from the input pulsed voltage waveform with the voltage divider 112 and generating a filtered voltage waveform by low pass filtering the voltage divided waveform with the low pass filter 114. In another example, the input channel $110_1$ omits the low pass filter 114 and generating output waveform comprises generating a divided voltage waveform from the input pulsed voltage waveform with the voltage divider 112.

At operation 1120, a second output waveform is generated by a second input channel 110. For example, the input channel $110_2$ acquires an input pulsed voltage waveform $140_2$ and generates an output waveform $144_2$ from the input pulsed voltage waveform $140_2$. The input channel $110_2$ may include a voltage divider 112 and a low pass filter 114 and generating the output waveform $144_2$ comprises generating a divided voltage waveform from the input pulsed voltage waveform with the voltage divider 112 and generating a filtered voltage waveform by low pass filtering the voltage divided waveform with the low pass filter 114.

At operation 1130, a third output waveform is generated by a third input channel 110. For example, in one embodiment, the input channel $110_3$ acquires an input pulsed voltage waveform $140_3$ and generates an output waveform $144_3$ from the input pulsed voltage waveform $140_3$. The input channel $110_3$ may include a low pass filter 114 and generating the output waveform $144_3$ comprises generating a filtered voltage waveform formed by low pass filtering the input pulsed voltage waveform $140_3$ by use of the low pass filter 114.

At operation 1140, one or more waveform characteristics are determined. For example, the acquisition channels $122_1$, $122_2$ and $122_3$ receives their respective output waveforms $144_1$, $144_2$ and $144_3$ from the input channel 110, $110_2$ and $110_3$ and provide the output waveforms to the data acquisition controller 123 to determine one or more waveform characteristics based on the different types of voltage waveform information received from the output waveforms $144_1$, $144_2$ and $144_3$. In some embodiments, the one or more waveform characteristics determined by the acquisition channel $122_1$ differs from the one or more waveform characteristics determined by the acquisition channel $122_2$, and the one or more waveform characteristics determined by the acquisition channel $122_3$ differ from the one or more waveform characteristics determined by the acquisition channel $122_1$ and the acquisition channel $122_2$. Further, in one example, data acquisition controller 123 in combination with the acquisition channel $122_1$ determines an amplitude (Ampl) and a pulse width W from the corresponding measured waveform, the data acquisition controller 123 in combination with the acquisition channel $122_2$ determines an ion current offset from the corresponding measured waveform, and the data acquisition controller 123 in combination with the acquisition channel $122_3$ determines the maximum ion current from the corresponding received output waveforms.

At operation 1150, one or more control parameters are generated from the waveform characteristics determined by the data acquisition controller 123 based on the information received from in the output waveforms $144_1$, $144_2$ and $144_3$. For example, the data acquisition controller 123 transmits information corresponding to the one or more waveform characteristics to a feedback processor 125 (or separate controller) and the feedback processor 125 (or separate controller) generates the one or more control parameters from the one or more determined waveform characteristics. During operation 1150, the feedback processor 125 receives the determined one or more waveform characteristics and then by use of one or more algorithms generates one or more control parameters based on the one or more received waveform characteristics. In one embodiment, the one or more control parameters may include an indication to adjust a DC charge voltage, adjust a pulse width, and adjust an amplitude of a pulse voltage waveform based on a comparison between waveform characteristics received from two or more different input channels and target waveform characteristics stored in a memory of the feedback processor 125 or a memory coupled to the feedback processor 125.

At operation 1160, as similarly discussed above in operation 1050, the feedback processor 125 transmits the information corresponding to the generated control parameters to the PVWG 150.

Further, operation 1170 is generally similar to that of operation 1060, and thus an adjusted pulsed voltage waveform is delivered from the PVWG 150 based on the received one or more control parameters. For example, the PVWG 150 generates an adjusted pulsed voltage waveform that is provided to the biasing electrode 804. Additionally, at operation 1170, a set point for a chucking power supply is also optionally adjusted.

In some embodiments of method 1100, operations 1110-1170 are performed multiple times until an adjusted pulsed voltage waveform having desirable pulse waveform characteristics (e.g., target waveform characteristics) is achieved. In some embodiments, operations 1110-1170 are performed a plurality of times until one or more target waveform characteristics of a pulsed voltage waveform within one waveform cycle are reached.

While the foregoing is directed to embodiments of the present disclosure, other and further embodiments of the disclosure may be devised without departing from the basic scope thereof, and the scope thereof is determined by the claims that follow.

What is claimed is:

1. A data acquisition system comprising:
   a first input channel coupled to an output of a first pulsed voltage waveform generator that is coupled to an electrode, wherein
      the first input channel is configured to receive a first input voltage waveform from the first pulsed voltage waveform generator, and
      the first input voltage waveform comprises a first pulsed voltage waveform; and
   a fast data acquisition module comprising:
      a first acquisition channel that is configured to generate a first digitized voltage waveform from the first input voltage waveform; and
      a data acquisition controller configured to determine one or more waveform characteristics of the first input voltage waveform by analyzing the first digitized voltage waveform,
      wherein the data acquisition controller is further configured to generate information corresponding to the determined one or more waveform characteristics for display on a display device.

2. The data acquisition system of claim 1, wherein the first input channel comprises first conditioning circuitry, and wherein generating the first digitized voltage waveform comprises, by use of the first conditioning circuitry, conditioning the first input voltage waveform before generating the first digitized voltage waveform.

3. The data acquisition system of claim 1, wherein the electrode is a biasing electrode that is disposed within a substrate support assembly disposed within a plasma processing chamber.

4. The data acquisition system of claim 1, wherein the one or more waveform characteristics corresponds to at least one selected from a group comprising an amplitude, a pulse width, a direct current (DC) offset, and an ion current.

5. The data acquisition system of claim 1, further comprising:
   a second input channel coupled to the output of the first pulsed voltage waveform generator, wherein
      the first input channel and the second input channel are coupled to an electrical conductor that is coupled to the output of the first pulsed voltage waveform generator at an end and coupled to the electrode at the opposing end, and
      the second input channel is configured to receive a second input voltage waveform derived from the first input voltage waveform provided from the first pulsed voltage waveform generator; and
   the fast data acquisition module further comprises:
      a second acquisition channel that is configured to generate a second digitized voltage waveform from the second input voltage waveform; and
      the data acquisition controller is configured to determine one or more waveform characteristics of the second input voltage waveform by analyzing the second digitized voltage waveform,
      wherein the data acquisition controller is further configured to generate information corresponding to the determined one or more waveform characteristics of the second input voltage waveform for display on the display device.

6. The data acquisition system of claim 5, wherein the electrical conductor comprises at least one of a coaxial transmission line, an insulated high-voltage corona-resistant hookup wire, a bare wire, a metal rod, or an electrical connector.

7. The data acquisition system of claim 5, wherein a generator coupling assembly couples the electrical conductor to the electrode.

8. The data acquisition system of claim 7, wherein an input of the first input channel is electrically coupled to an end of the generator coupling assembly.

9. The data acquisition system of claim 1, further comprising:

a second input channel coupled to a current sensing element of the first pulsed voltage waveform generator, wherein the fast data acquisition module further comprises:
a second acquisition channel that is configured to generate a digitized waveform generated from a waveform signal received from the current sensing element; and
the data acquisition controller is configured to determine one or more characteristics of the digitized waveform,
wherein the data acquisition controller is further configured to generate information corresponding to the determined one or more characteristics of the digitized waveform for display on the display device.

10. A method comprising:
generating, via a first input channel of a data acquisition system, a first voltage waveform from a first input voltage waveform, wherein the first input voltage waveform corresponds to a pulsed voltage waveform established on a load;
determining, via a data acquisition controller of a fast data acquisition module of the data acquisition system, one or more waveform characteristics of the first voltage waveform; and
generating, via the data acquisition controller of the fast data acquisition module, information corresponding to the determined one or more waveform characteristics for display on a display device.

11. The method of claim 10, wherein the first input channel comprises first conditioning circuitry configured to generate the first voltage waveform.

12. The method of claim 11 further comprises:
generating, via the first input channel of the fast data acquisition module, a first digital voltage waveform from the first voltage waveform; and
analyzing the first digital voltage waveform to determine the one or more waveform characteristics.

13. The method of claim 12 further comprising:
generating, via a second input channel of the data acquisition system, a second voltage waveform from a second input voltage waveform, wherein the second input voltage waveform corresponds to the pulsed voltage waveform established on the load;
generating, via a second acquisition channel of the fast data acquisition module, a second digital voltage waveform from the second voltage waveform; and
generating the one or more waveform characteristics based on the second digital voltage waveform.

14. The method of claim 10, wherein the one or more waveform characteristics corresponds to at least one selected from a group comprising an amplitude, a pulse width, a direct current (DC) offset, and an ion current.

15. The method of claim 10, wherein the pulsed voltage waveform is established on the load by a pulsed voltage waveform generator electrically coupled to the load through an electrical conductor using a generator coupling assembly.

16. The method of claim 15, wherein an input of the first input channel is electrically coupled to an end of the generator coupling assembly.

17. The method of claim 16, wherein the load is a biasing electrode disposed within a substrate support assembly disposed within a processing chamber.

18. A processing chamber comprising:
a substrate support comprising a biasing electrode;
a pulsed voltage waveform generator configured to establish a pulsed voltage waveform on the biasing electrode; and
a data acquisition system comprising:
a first input channel configured to generate a first voltage waveform from a first input voltage waveform corresponding to the pulsed voltage waveform; and
a fast data acquisition module comprising a data acquisition controller configured to:
determine one or more waveform characteristics of the first voltage waveform; and
communicate information corresponding to the one or more waveform characteristics to be displayed on a monitor.

19. The processing chamber claim 18, wherein the first input channel comprises first conditioning circuitry configured to generate the first voltage waveform, and wherein the fast data acquisition module further comprises a first acquisition channel coupled to an output of the first input channel and configured to generate a first digital voltage waveform from the first voltage waveform, and wherein the data acquisition controller is configured to analyze the first digital voltage waveform to determine the one or more waveform characteristics.

20. The processing chamber claim 18, wherein the one or more waveform characteristics corresponds to at least one selected from a group comprising an amplitude, a pulse width, a direct current (DC) offset, and an ion current.

* * * * *